(12) United States Patent
Ueno et al.

(10) Patent No.: US 10,840,283 B2
(45) Date of Patent: *Nov. 17, 2020

(54) IMAGING ELEMENT AND IMAGING APPARATUS

(71) Applicant: SONY CORPORATION, Tokyo (JP)

(72) Inventors: Yosuke Ueno, Kanagawa (JP); Yusuke Ikeda, Tokyo (JP); Shizunori Matsumoto, Kanagawa (JP); Tsutomu Haruta, Kanagawa (JP); Rei Yoshikawa, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/698,615

(22) Filed: Nov. 27, 2019

(65) Prior Publication Data

US 2020/0098805 A1  Mar. 26, 2020

Related U.S. Application Data

(63) Continuation of application No. 15/982,717, filed on May 17, 2018, now Pat. No. 10,529,756, which is a continuation of application No. 15/118,956, filed as application No. PCT/JP2015/000720 on Feb. 17, 2015, now Pat. No. 10,008,525.

(30) Foreign Application Priority Data

Feb. 25, 2014 (JP) .................................. 2014-034369

(51) Int. Cl.
*H01L 27/146* (2006.01)
*H04N 5/357* (2011.01)
*H04N 5/369* (2011.01)
*H04N 5/3745* (2011.01)
*H04N 5/378* (2011.01)

(52) U.S. Cl.
CPC .. *H01L 27/14614* (2013.01); *H01L 27/14601* (2013.01); *H01L 27/14609* (2013.01); *H01L 27/14612* (2013.01); *H01L 27/14627* (2013.01); *H01L 27/14634* (2013.01); *H04N 5/357* (2013.01); *H04N 5/3698* (2013.01); *H04N 5/378* (2013.01); *H04N 5/3745* (2013.01); *H01L 27/14643* (2013.01)

(58) Field of Classification Search
None
See application file for complete search history.

(56) References Cited

U.S. PATENT DOCUMENTS

| 8,766,160 | B2 * | 7/2014 | Kato | H01L 27/14612 |
| | | | | 250/208.1 |
| 9,628,737 | B2 * | 4/2017 | Kato | H04N 5/361 |
| 9,634,060 | B2 * | 4/2017 | Shizukuishi | H01L 27/14634 |
| 10,008,525 | B2 * | 6/2018 | Ueno | H01L 27/14612 |

(Continued)

*Primary Examiner* — Lex H Malsawma
(74) *Attorney, Agent, or Firm* — Sheridan Ross P.C.

(57) ABSTRACT

An imaging element comprises a photoelectric conversion unit formed in a pixel region and configured to convert light into electrical charge. Further, the imaging element includes a transistor formed in the pixel region and configured to transfer electric charge from the photoelectric conversion unit. The photoelectric conversion unit of the imaging element may be connected to a well of the pixel region, where the well of the pixel region has a negative potential.

20 Claims, 15 Drawing Sheets

(56) References Cited

U.S. PATENT DOCUMENTS

| | | | |
|---|---|---|---|
| 10,529,756 B2* | 1/2020 | Ueno | H01L 27/14601 |
| 2008/0290382 A1* | 11/2008 | Hirota | H01L 27/14627 |
| | | | 257/291 |
| 2013/0092820 A1* | 4/2013 | Takemoto | H04N 5/369 |
| | | | 250/208.1 |
| 2013/0248954 A1* | 9/2013 | Ahn | H01L 31/0232 |
| | | | 257/292 |
| 2013/0250151 A1* | 9/2013 | Kato | H04N 5/335 |
| | | | 348/300 |
| 2014/0054447 A1* | 2/2014 | Kato | H01L 27/14612 |
| | | | 250/208.1 |

* cited by examiner

US 10,840,283 B2

IMAGING ELEMENT AND IMAGING APPARATUS

CROSS-REFERENCE TO RELATED APPLICATIONS

This application is a continuation of U.S. patent application Ser. No. 15/982,717, filed May 17, 2018, which is a continuation of U.S. patent application Ser. No. 15/118,956, filed Aug. 15, 2016, now U.S. Pat. No. 10,008,525, which is a national stage application under 35 U.S.C. 371 and claims the benefit of PCT Application No. PCT/JP2015/000720 having an international filing date of Feb. 17, 2015, which designated the United States, which PCT application claimed the benefit of Japanese Patent Application No. 2014-034369 filed Feb. 25, 2014, the disclosures of which are incorporated herein by reference in their entirety.

TECHNICAL FIELD

The present technique relates to an imaging element and an imaging apparatus and specifically relates to an imaging element and an imaging apparatus which are capable of reducing power consumption while controlling deterioration of image quality.

BACKGROUND ART

Recently, as production techniques improve, electronic devices and/or electronic circuits have become smaller and consume less power. In addition, it is further desired to design imaging elements such that they consume less power.

However, in an imaging element where a power supply potential is simply reduced or otherwise lowered in order to achieve low power consumption, a pixel characteristic also changes and the image quality of an image that is read may be greatly deteriorated. Thus, decreasing noise and performing low-voltage driving by connecting, to a negative power supply, a light receiving element configured to perform photoelectric conversion has been considered (see, for example, Patent Literature 1).

CITATION LIST Patent Literature

PTL 1: JP 2009-117613 A

SUMMARY OF INVENTION

Technical Problem

However, in such a configuration and as described in Patent Literature 1, when the ground potential is negative, an operating characteristic of each transistor in a pixel may be different from the configuration where the ground potential of the light receiving element is 0 V. Also, in such embodiments, it has been necessary to use a depression-type transistor. Thus, where the configuration described in Patent Literature 1 is utilized, since it is not possible to use the same operating characteristic of a transistor when the ground potential of the light receiving element is 0 V, it has been necessary to redesign the operating characteristic of each transistor such that the pixel characteristic becomes optimal. Thus, difficulties in operation and a deterioration of the image quality may result.

The present technique has been proposed in view of the forgoing circumstance in order to reduce power consumption while controlling a deterioration of image quality.

Solution to Problem

An imaging element of the present technique includes a pixel region in which a photoelectric conversion unit configured to photoelectrically convert incident light and a transistor configured to control a transfer of a charge accumulated in the photoelectric conversion unit are formed as a unit pixel on a well, wherein the photoelectric conversion unit is connected to a well potential of the pixel region, and the well potential of the pixel region is set as a negative potential.

A peripheral circuit region, in which a circuit to which the charge is transmitted as a signal from the unit pixel is formed, can be further included in an area outside of the pixel region, wherein the well potential of the pixel region may be set such that the well potential of the pixel region is lower than the well potential of the peripheral circuit region.

A power supply potential of a circuit, including the photoelectric conversion unit and the transistor, can be configured such that it is identical to the power supply potential of the circuit in the peripheral circuit region.

The circuit may include an A/D conversion unit configured to perform A/D conversion of the signal that is transmitted from the unit pixel.

A plurality of semiconductor substrates superimposed, or stacked, on each other may be included, wherein the pixel region and the peripheral circuit region may be respectively formed on the semiconductor substrates.

A negative potential generation unit, which is configured to generate the well potential of the pixel region, may be further included in the peripheral circuit region.

The photoelectric conversion unit may include a photodiode connected to the well potential of the pixel region; a readout transistor configured to control readout from the photodiode; a reset transistor configured to reset floating diffusion region to which a charge read from the photodiode is transferred; an amplifier transistor configured to amplify a potential of the floating diffusion region; and a selection transistor configured to control a transfer of a signal output from the amplifier transistor.

A gate potential of the readout transistor when the readout transistor is off may be set such that the gate potential is lower than the well potential of the pixel region.

A negative potential generation unit, which is configured to generate the gate potential when the readout transistor is off, may be included in the peripheral circuit region.

An imaging apparatus of the present technique includes: an imaging element including a pixel region in which a photoelectric conversion unit configured to photoelectrically convert incident light and a transistor configured to control a transfer of a charge accumulated in the photoelectric conversion unit are formed as a unit pixel on a well. The photoelectric conversion unit may be connected to the well potential of the pixel region, in which the well potential of the pixel region may be set or otherwise configured as a negative potential; and an image processing unit configured to perform image processing of an image of an object.

In an aspect of the present technique, in an imaging element, a photoelectric conversion unit configured to photoelectrically convert incident light and a transistor configured to control a transfer of a charge accumulated in the photoelectric conversion unit are formed, as a unit pixel, on a well in a pixel region. The photoelectric conversion unit is connected to a well potential of the pixel region and the well potential of the pixel region is set as a negative potential.

In another aspect of the present technique, in an imaging apparatus, a photoelectric conversion unit configured to photoelectrically convert incident light and a transistor configured to control a transfer of a charge accumulated in the photoelectric conversion unit are formed, as a unit pixel, on a well in a pixel region. The photoelectric conversion unit is connected to a well potential of the pixel region and the well potential of the pixel region is set as a negative potential. An image of an object, which is acquired in the pixel region, may be subjected to further image processing.

It is yet another aspect of the present disclosure to provide an imaging element. The imaging element may include a photoelectric conversion unit formed in a pixel region and configured to convert light into electrical charge, and a transistor formed in the pixel region and configured to transfer electric charge from the photoelectric conversion unit. The photoelectric conversion unit may be connected to a well of the pixel region having a negative potential.

It is yet another aspect of the present disclosure to provide an electronic apparatus. The electronic apparatus may include an optical unit having one or more lenses, an analog to digital converter unit, and an image sensor unit including a plurality of unit pixels formed in a pixel region and arranged in a two-dimensional matrix. Each unit pixel of the plurality of unit pixels may include a photoelectric conversion unit formed in the pixel region and configured to convert light into electrical charge and a transistor formed in the pixel region and configured to transfer electric charge from the photoelectric conversion unit. The photoelectric conversion unit may be connected to a well of the pixel region having a negative potential.

It is yet another aspect of the present disclosure to provide an imaging element. The imaging element may include a photoelectric conversion unit connected to a well of a pixel region having a negative potential and configured to convert light into electrical charge, a floating diffusion region configured to generate a voltage according to an amount of electrical charge transferred from the photoelectric conversion unit, a reset transistor configured to initialize an amount of electrical charge accumulated in the floating diffusion region, a readout transistor configured to transfer electric charge from the photoelectric conversion unit to the floating diffusion region, a negative voltage generator, and a switch, wherein in a first configuration, the switch electrically connects a gate of the readout transistor to a common power supply potential, and in a second configuration, the switch electrically connects the gate of the readout transistor to a negative potential provided by the negative voltage generator, the negative potential being less than the common power supply potential and the negative potential of the pixel region.

Advantageous Effects of Invention

According to an embodiment of the present technique, a signal can be processed. Also, according to an embodiment of the present technique, the resolution and/or the image acquisition time may be improved.

DESCRIPTION OF EMBODIMENTS

In the following, a mode to carry out the present disclosure (hereinafter, referred to as embodiment) will be described. Note that the description will be made in the following order.

1. Lowering power supply potential
2. First embodiment (imaging element)
3. Second embodiment (imaging element)
4. Third embodiment (imaging element)
5. Fourth embodiment (imaging apparatus)

<1. Lowering Power Supply Potential>
<Lower Potential and Pixel Characteristic>

Recently, as production techniques have improved, each of an electronic device, an information processing apparatus, and the like become small and tend to consume less power; thus, an electronic circuit provided, for example, as a component part thereof, also may be small and may consume less power. Similarly, it may be desired to utilize an imaging element that consumes less power.

Figure 1:
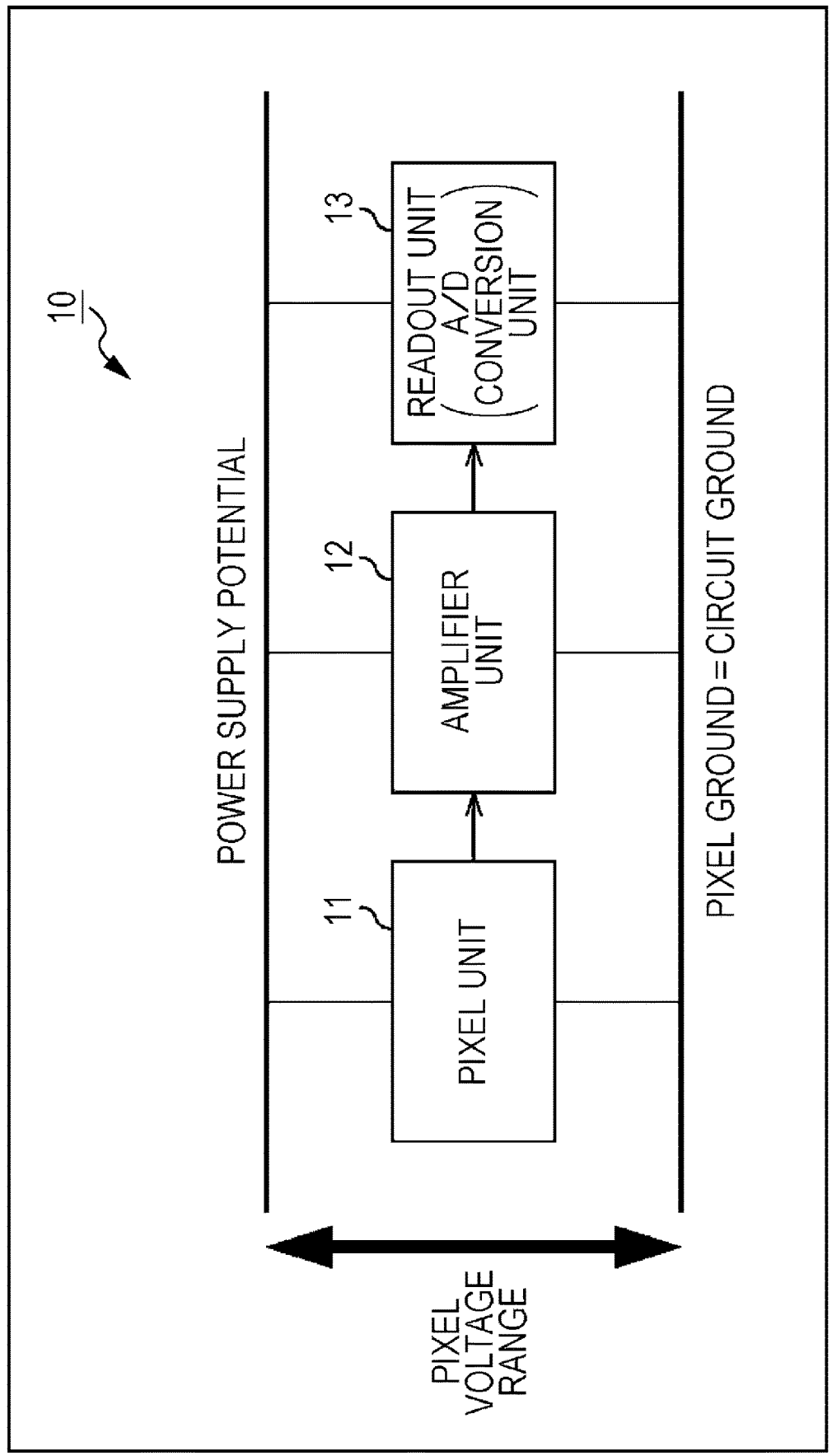
FIG. 1 is a view illustrating a main configuration example of an imaging element.

FIG. 1 illustrates an example configuration of an imaging element 10. As illustrated in FIG. 1, in an imaging element 10, a pixel unit 11 photoelectrically converts incident light to an electric signal and provides this electric signal to an amplifier unit 12. The amplifier unit 12 amplifies the electric signal provided by the pixel unit 11 and provides the amplified electric signal to a readout unit 13. The readout unit 13 may then perform analog to digital (A/D) conversion of the electric signal amplified in the amplifier unit 12 and read the converted electric signal as image data. For example, the pixel unit 11, including a photodiode, a transistor, or the like, and the amplifier unit 12, including a transistor or the like, are formed as a unit pixel in a pixel region. The readout unit 13 includes an A/D conversion unit, or the like, and is formed, as a peripheral circuit of the pixel region, in an area outside of the pixel region (peripheral circuit region).

As illustrated in FIG. 1, the pixel unit 11, the amplifier unit 12, and the readout unit 13 utilize a common power supply potential and ground potential. That is, a potential, such as a voltage potential, of the ground of the pixel unit 11 (hereinafter, also referred to as pixel ground), a potential of the ground of the amplifier unit 12, and a potential of the ground of the readout unit 13 (hereinafter, also referred to as circuit ground) are the same or substantially similar.

In the imaging element 10 of such a configuration, the power consumption of the amplifier unit 12 and/or the readout unit 13 having the A/D conversion unit, or the like, tends to be large. Thus, for example, when a power supply potential, such as a supply voltage, is reduced or otherwise lowered (when the potential is lowered) to reduce the power consumption of these units, the power supply potential of the pixel unit 11 is also reduced or otherwise lowered and the pixel voltage range becomes narrower. Thus, a characteristic of a pixel, such as the number of saturation electrons Qs or the completeness of charge transfer, is deteriorated greatly and the quality of the acquired image data in the imaging element 10 may be likewise deteriorated.

<Making the Gate Potential into a Negative Potential>

Incidentally, in the unit pixel such as unit pixel 10, a method exists to control the generation of noise. In one embodiment, the generation of noise may be controlled by switching the gate potential, such as the gate voltage, to a negative potential, such as a negative voltage, when the readout transistor is turned off, where the read out transistor controls the readout of charge from the photodiode.

Figure 2:
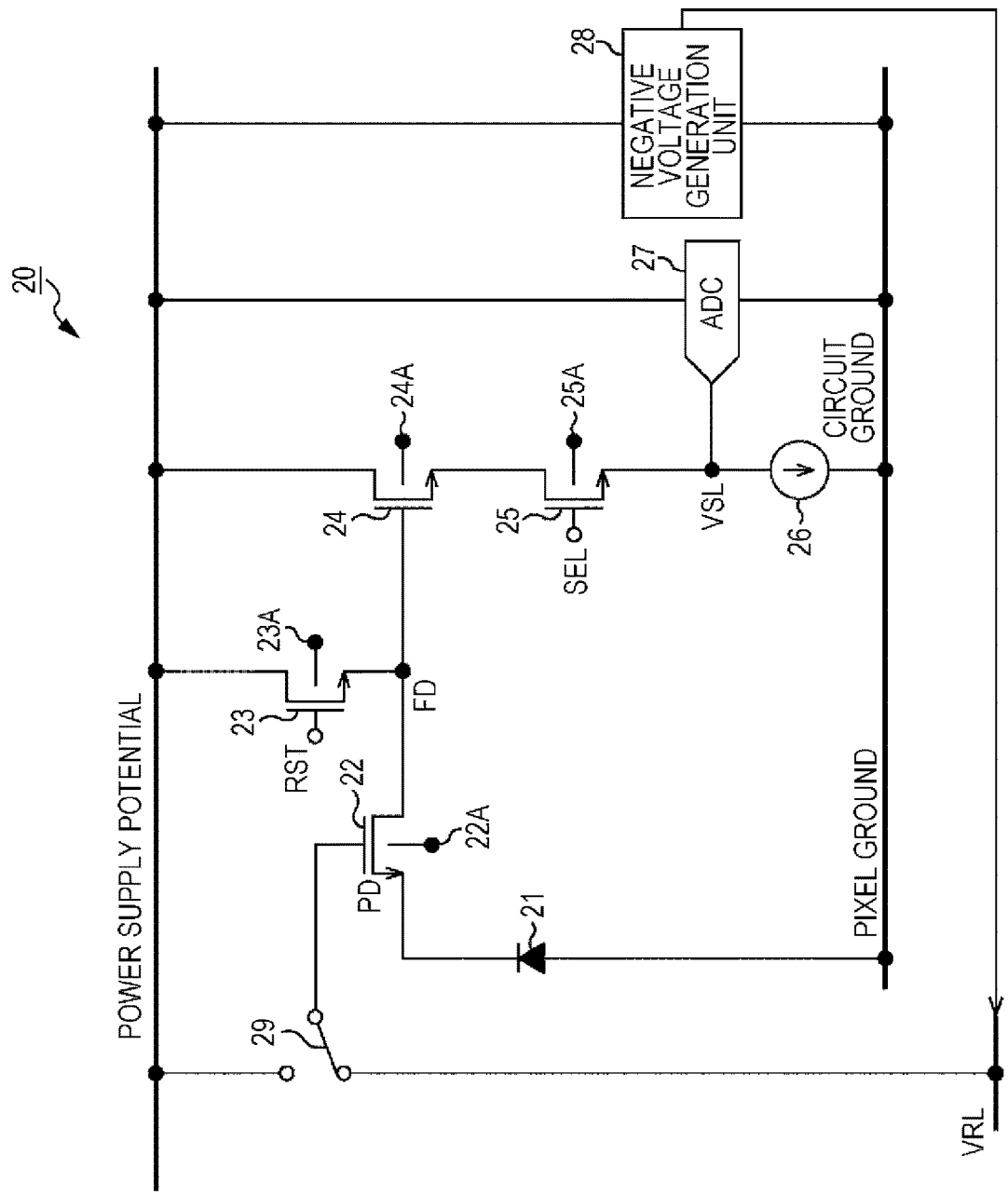
FIG. 2 is a view illustrating a different configuration example of the imaging element.

An example configuration of a portion of the imaging element is illustrated in FIG. 2. As illustrated in FIG. 2, in an imaging element 20, incident light from an object is photoelectrically converted in a photodiode (PD) 21 and is accumulated as a charge. A readout transistor 22 controls the readout of a charge from the photodiode 21. The charge read through the readout transistor 22 is provided to a floating diffusion region (FD). A reset transistor 23 resets the floating diffusion region. A charge of the floating diffusion region is amplified as a signal by an amplifier transistor 24 and is provided to a vertical signal line (VSL) through a selection transistor 25. The vertical signal line (VSL) is connected to ground (hereinafter, also referred to as circuit ground) through a current source 26 and is also connected to an analog to digital converter (ADC) 27, which may be located in a peripheral circuit. An electric signal provided by the selection transistor 25 is provided to the ADC 27 through the vertical signal line and is A/D converted. Then, the converted signal is output as digital data (pixel data), for example, to an outer part of the imaging element 20. The gate potential of the readout transistor 22 may be switched to the power supply potential (when being on) or low potential reference voltage (VRL) (when being off) by a switch 29. A negative voltage generation unit 28 generates the potential of the VRL.

In one embodiment, the photodiode 21, the readout transistor 22, the reset transistor 23, the amplifier transistor 24, and the select transistor 25 are formed, as a unit pixel, in the pixel region, while the current source 26, the ADC 27, the negative voltage generation unit 28, and the switch 29 are formed as a peripheral circuit in an area outside of the pixel region (also referred to as a peripheral circuit region).

As illustrated in FIG. 2, the pixel region and the peripheral circuit region may have a common power supply potential. The well potential of the pixel ground to which the photodiode 21 is connected, that of the circuit ground to which the current source 26, the ADC 27, and the negative voltage generation unit 28 are connected, and that of the pixel region (that is the well potential 22A of the readout transistor 22, the well potential 23A of the reset transistor 23, the well potential 24A of the amplifier transistor 24, and the well potential 25A of the selection transistor 25) are substantially identical. Also, when the readout transistor 22 is off, the VRL to which the switch 29 is connected; that is, the gate potential when the readout transistor 22 is off may be independent from the above potential.

Figure 3:
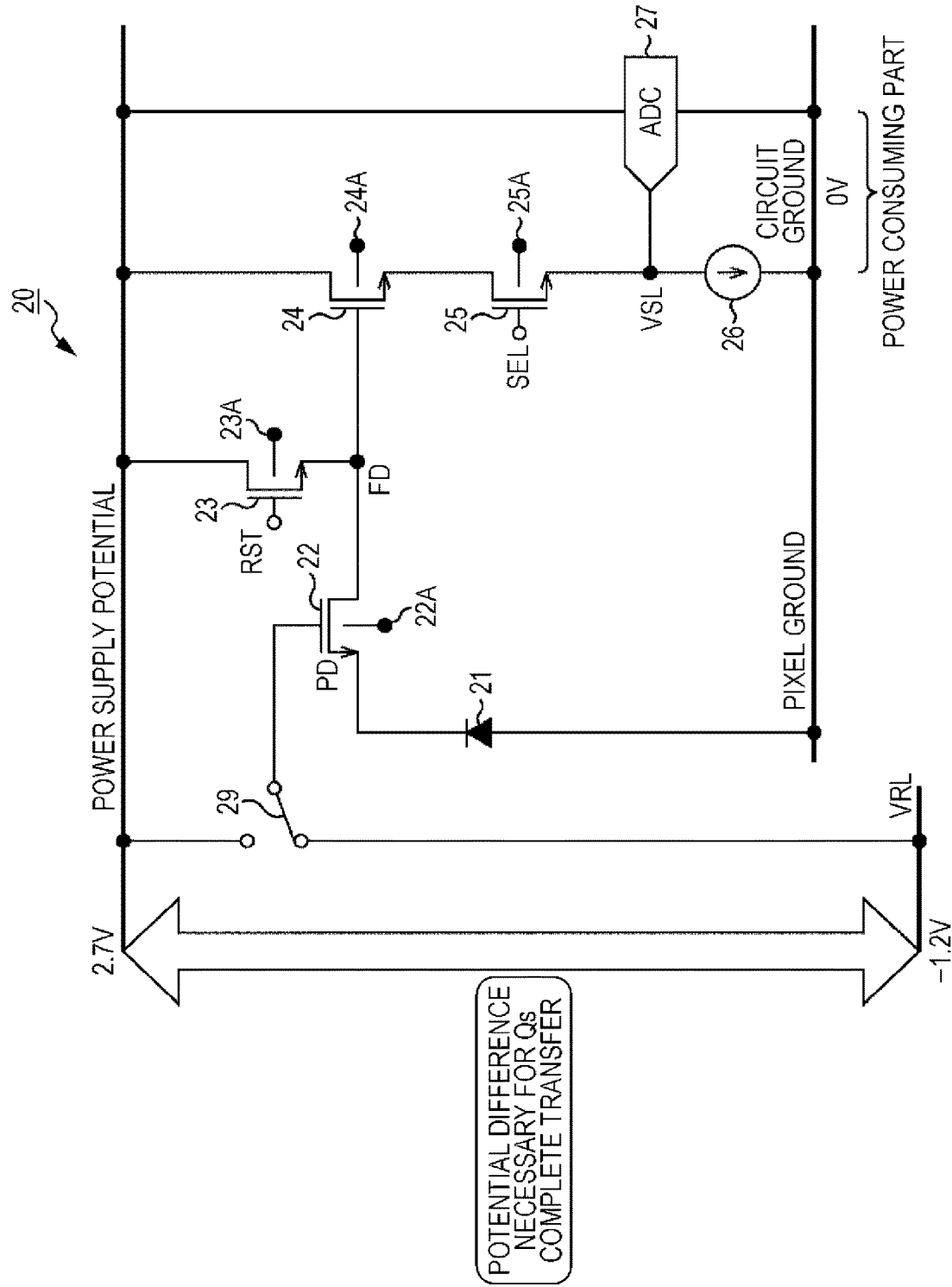
FIG. 3 is a view illustrating an example of each kind of potential.
Figure 4:
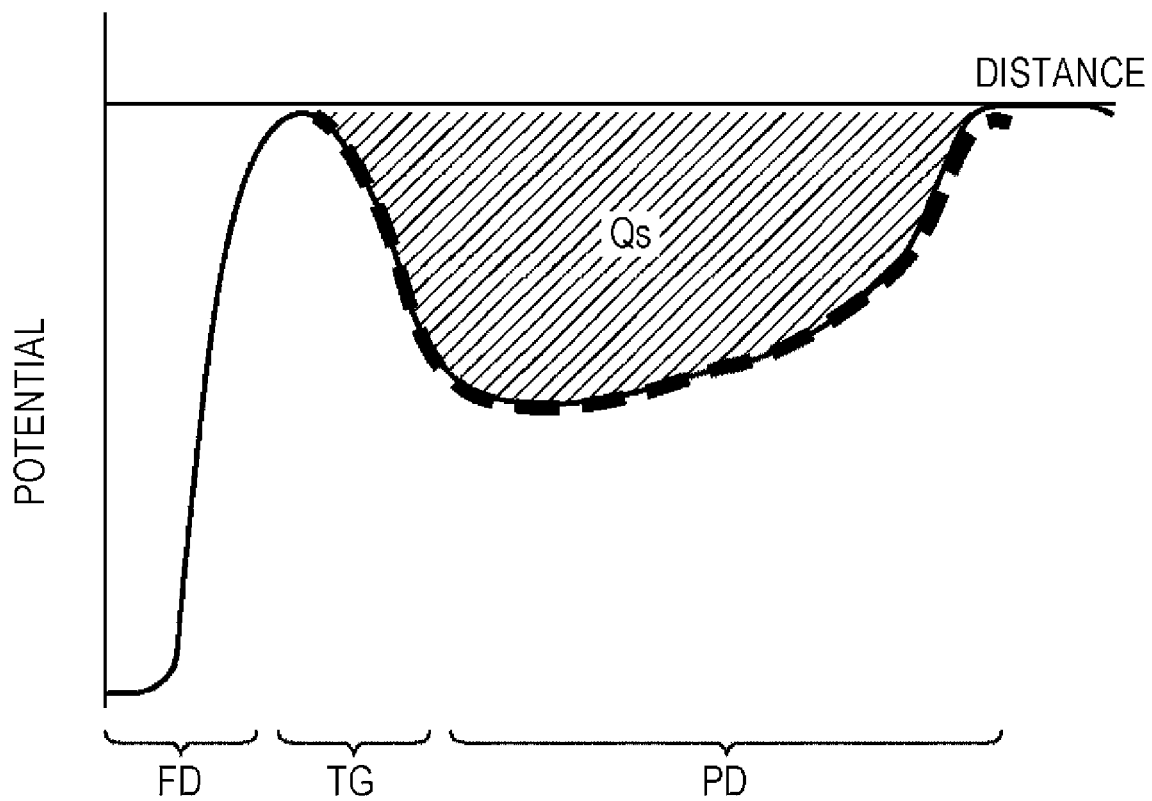
FIG. 4 is a view illustrating an example of the potential in a case of FIG. 3.

For example, as illustrated in FIG. 3, the negative voltage generation unit 28 sets a potential of the VRL as a negative potential such that the potential is lower than that of the circuit ground and the like. In accordance with an embodiment of the present disclosure, and as illustrated in FIG. 3, the power supply potential is set to 2.7 V and each of the pixel ground, the circuit ground, and the well potential is set to 0 V. On the other hand, the low voltage reference potential VRL is set to −1.2 V. In such a manner, and as illustrated in FIG. 4, by increasing a gate potential difference (for example, to 3.9 V) between a case where the readout transistor 22 is on and a case where the readout transistor 22 is off, the number of saturation electrons Qs of the photodiode 21 may be made adequately large and a complete transfer of a charge may be realized. That is, deterioration of image quality can be controlled.

Figure 5:
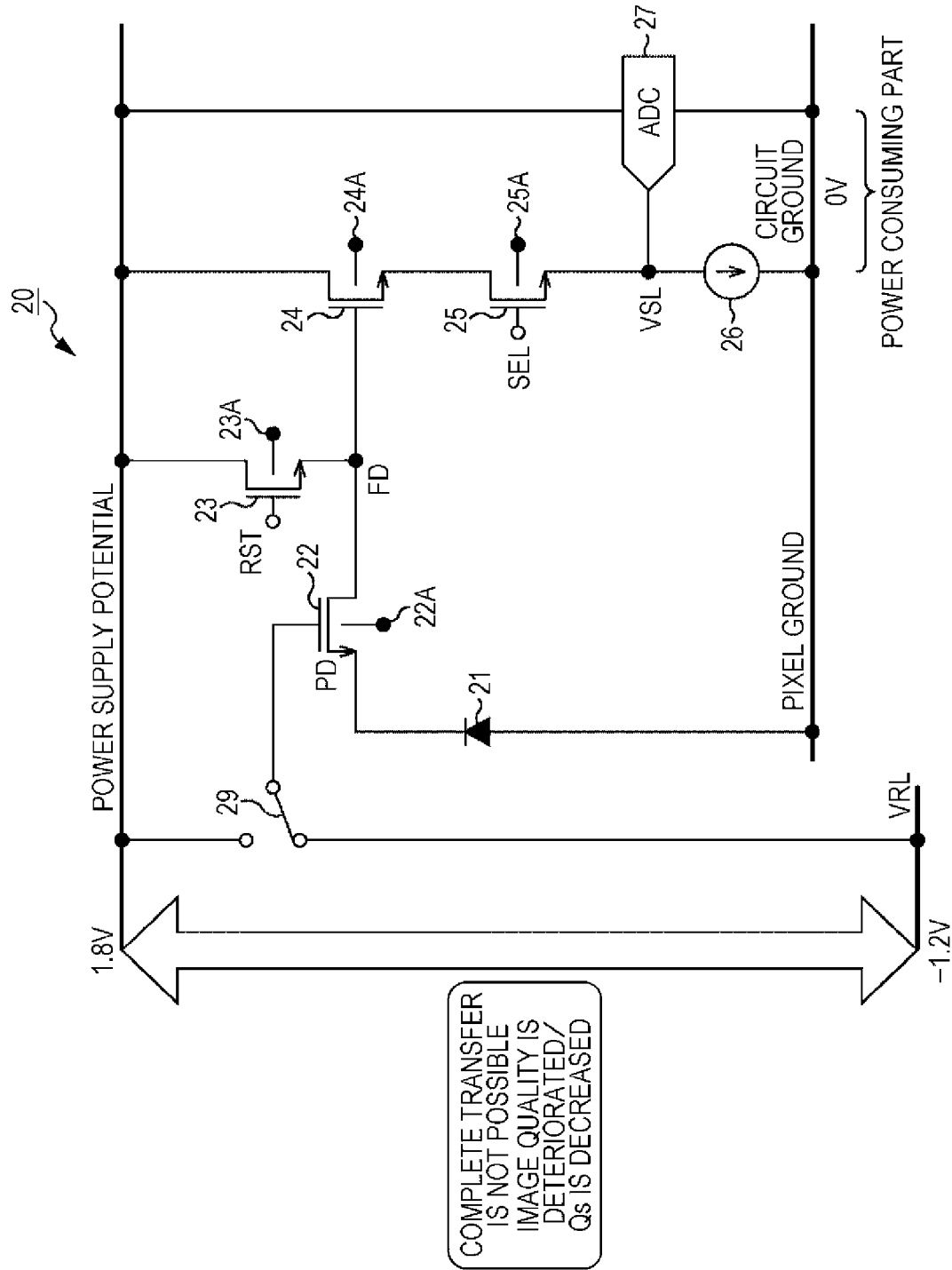
FIG. 5 is a view illustrating a different example of each kind of potential.
Figure 6:
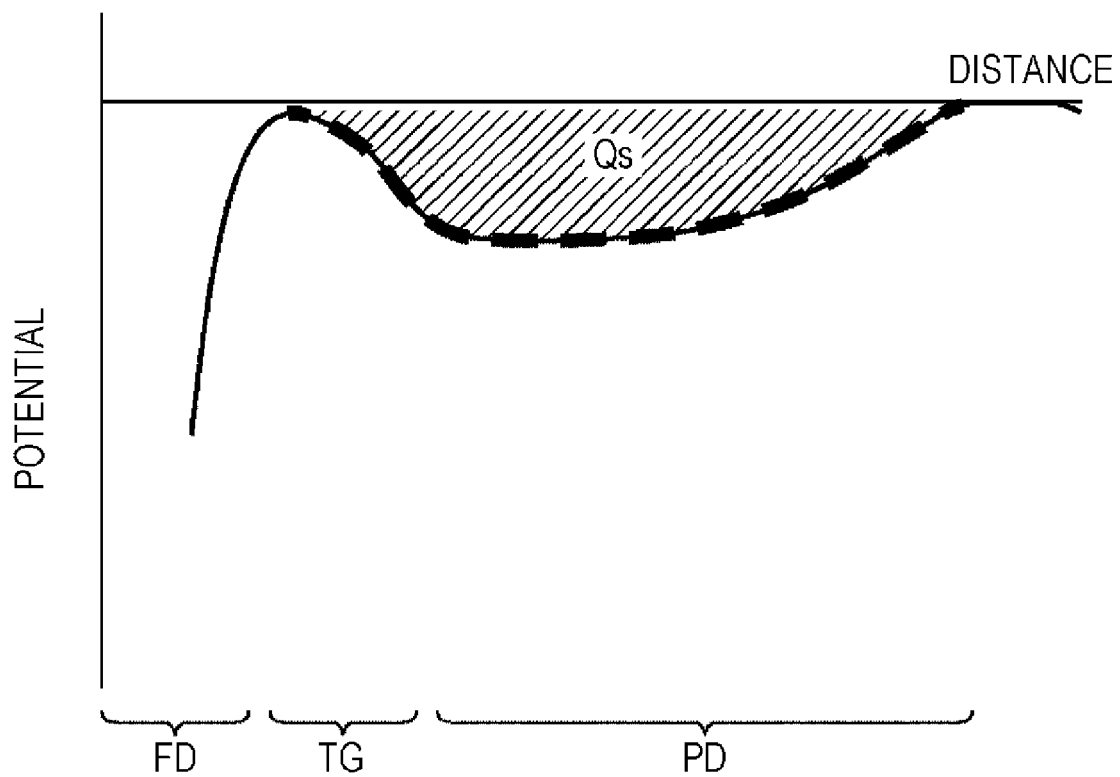
FIG. 6 is a view illustrating an example of the potential in a case of FIG. 5.

However, even if the gate potential is increased, when the power supply potential is reduced or otherwise lowered, in order to reduce power consumption in the amplifier transistor 24, the selection transistor 25, the current source 26, and the ADC 27 and the like (for example, the power consuming part), the power supply potential may be reduced to 1.8 V. As illustrated in FIG. 5, a gate potential difference between the case when the readout transistor 22 is on and the case when the readout transistor 22 is off is reduced and may become 3 V, for example. Thus, as illustrated in FIG. 6, the number of saturation electrons Qs of the photodiode 21 becomes small and therefore, it may become difficult to cause a number of saturation electrons Qs to be adequately large and realize a complete transfer of a charge. That is, image quality may be deteriorated.

<Making Light Receiving Element into Negative Potential>

Patent Literature 1 discloses reducing noise and performing low-voltage driving by connecting, to a negative power supply, a light receiving element configured to perform photoelectric conversion. However, in a configuration described in Patent Literature 1, because the ground potential is negative, an operating characteristic of each transistor in a pixel changes greatly from that in a case where ground potential of a light receiving element is 0 V. In addition, since a well potential of the pixel region is 0 V, it has been necessary to use, as each transistor in the pixel, a depression-type transistor having a negative gate cut-off voltage. Thus, since it is not possible to use a design value for an operating characteristic for a transistor when the ground potential of the light receiving element is 0 V, when the ground potential is negative, it has been necessary to utilize a new design such that one or more pixel characteristics are optimal. Moreover, utilizing a pixel characteristic equivalent to that in a case where the ground potential of the light receiving element is 0 V has not been feasible; thus, the pixel characteristic and image quality are deteriorated.

<2. First Embodiment>

<Making Well Potential of Pixel Region into Negative Potential>

Thus, in accordance with embodiments of the present disclosure, the imaging element includes a pixel region in which a photoelectric conversion unit photoelectrically converts incident light and a transistor that controls the transfer of a charge accumulated in the photoelectric conversion unit are formed as a unit pixel on a P-type or N-type well (i.e., a well formed in a substrate area). The photoelectric conversion unit is connected to the well potential of the pixel region and the well potential of the pixel region is set as a negative potential. Accordingly, it becomes possible to control the deterioration of a pixel characteristic and to reduce power consumption while controlling the deterioration of image quality.

In addition, and for example, such an imaging element may further include, in an area outside of the pixel region, a peripheral circuit region in which a circuit, to which a charge is transmitted as a signal from the unit pixel, is formed and a well potential of the pixel region may be set to a potential that is lower than the well potential of the peripheral circuit region. Where the imaging element includes a peripheral circuit other than the configuration in the pixel region, by setting the well potential of each region in such a manner, even when a potential difference between the power supply potential and the ground potential of the peripheral circuit region is reduced or otherwise lowered, a potential difference between the power supply potential and the ground potential of the pixel region can be maintained. Thus, it is possible to control the deterioration of a pixel characteristic and to reduce power consumption while controlling the deterioration of image quality.

Also, in such an imaging element, in a case where it is difficult to design the power supply potential of both regions to be different from each other, the power supply potential of a circuit in the pixel region that includes the photoelectric conversion unit and the transistor may be set to a substantially identical potential as that of the power supply potential of a circuit in the peripheral circuit region. As described above, by making the power supply potential of both regions identical and by setting the well potential (ground potential) of the pixel region to a negative potential which is lower than the well potential (ground potential) of the peripheral circuit region, it is possible to use a configuration design value where the ground potential of the light receiving element is 0 V, such as that in the example in FIG. 1, and further to reduce power consumption while controlling the deterioration of image quality.

In accordance with some embodiments of the present disclosure, such an imaging element may include, as a circuit in the peripheral circuit region, an A/D conversion unit configured to perform A/D conversion of a signal transmitted from the unit pixel. When the imaging element includes, as a peripheral circuit, a circuit, such as the A/D conversion unit that may consume a large amount of power, reducing or otherwise lowering the power supply potential further reduces the consumption of power. Thus, it becomes important to utilize the above-described configuration and to reduce power consumption while controlling the deterioration of image quality.

In addition, such an imaging element may further include, in the peripheral circuit region, a negative potential generation unit that generates the well potential of the pixel region. By generating the well potential (negative potential) of the pixel region in an inner part of the imaging element, it is not necessary to generate a negative potential in an outer part of the imaging element. Thus, it becomes possible to utilize the imaging element, to which the present technique is applied, in a circuit where the imaging element includes a configuration where the ground potential of the light receiving element is 0 V, such as that in the example in FIG. 1. Thus, the versatility of the imaging element is improved and it may be easier to design a circuit in a periphery of the imaging element which may reduce an associated design cost.

<Imaging Element>

Figure 7:
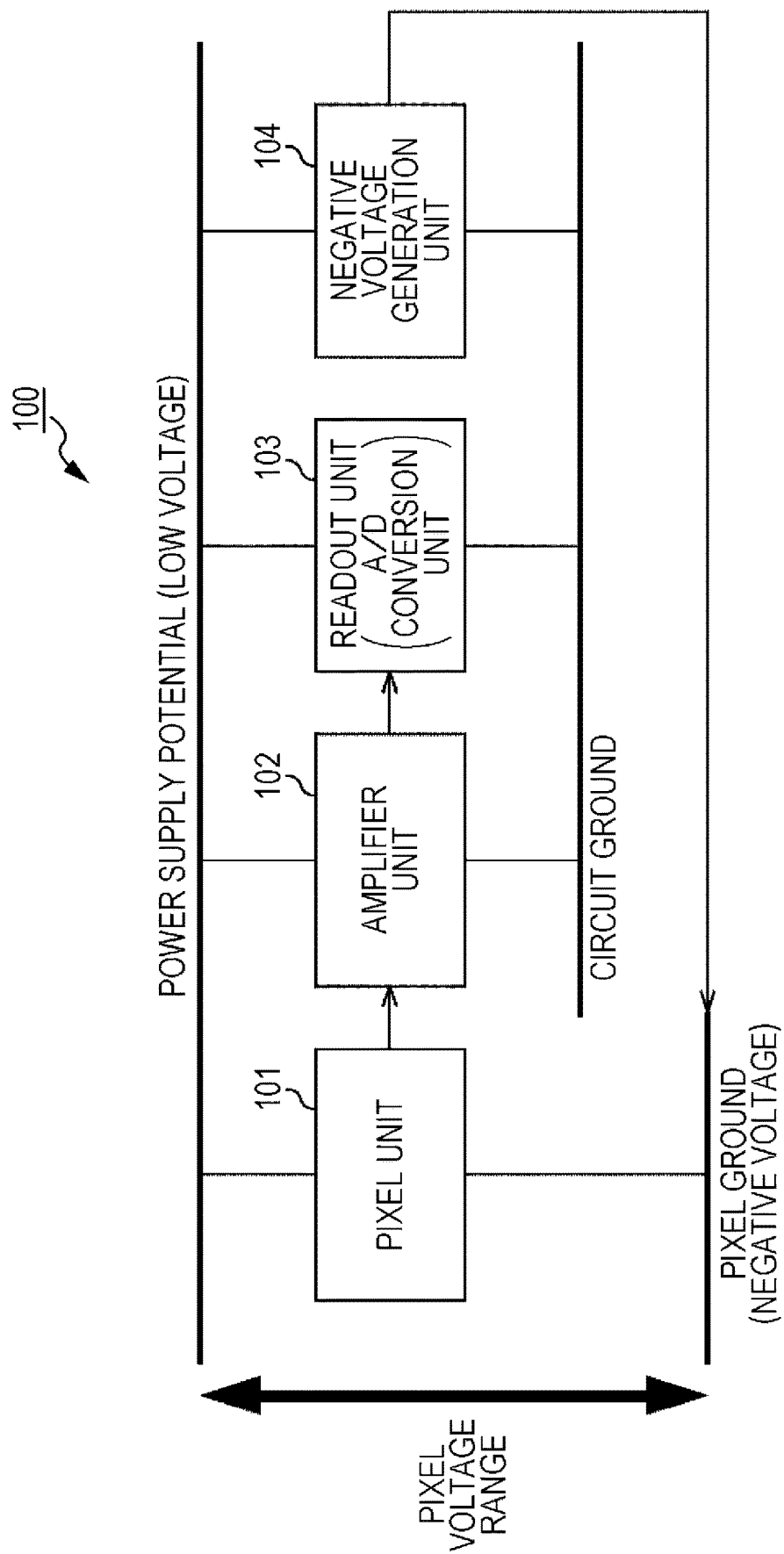
FIG. 7 is a view illustrating a different configuration example of the imaging element.

A configuration example of such an imaging element to which the present technique is applied is illustrated in FIG. 7. The imaging element 100, illustrated in FIG. 7, is a device that photoelectrically converts light transmitted from an object and outputs the converted light as image data. As illustrated in FIG. 7, the imaging element 100 includes a pixel unit 101, an amplifier unit 102, a readout unit (A/D conversion unit) 103, and a negative voltage generator, such as a negative voltage generation unit 104.

Figure 9:
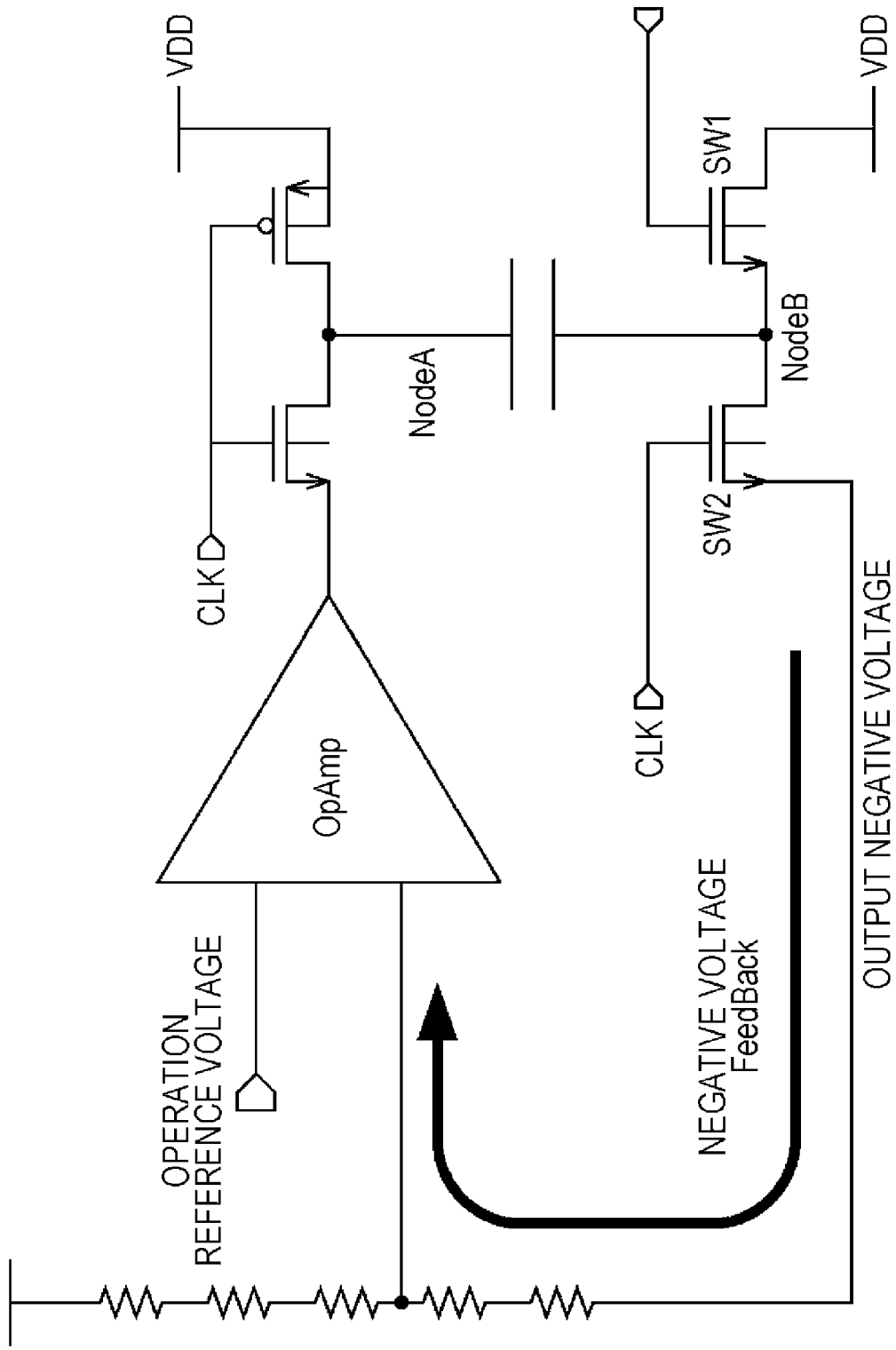
FIG. 9 is a view illustrating an example of a negative voltage generation unit.
Figure 10:
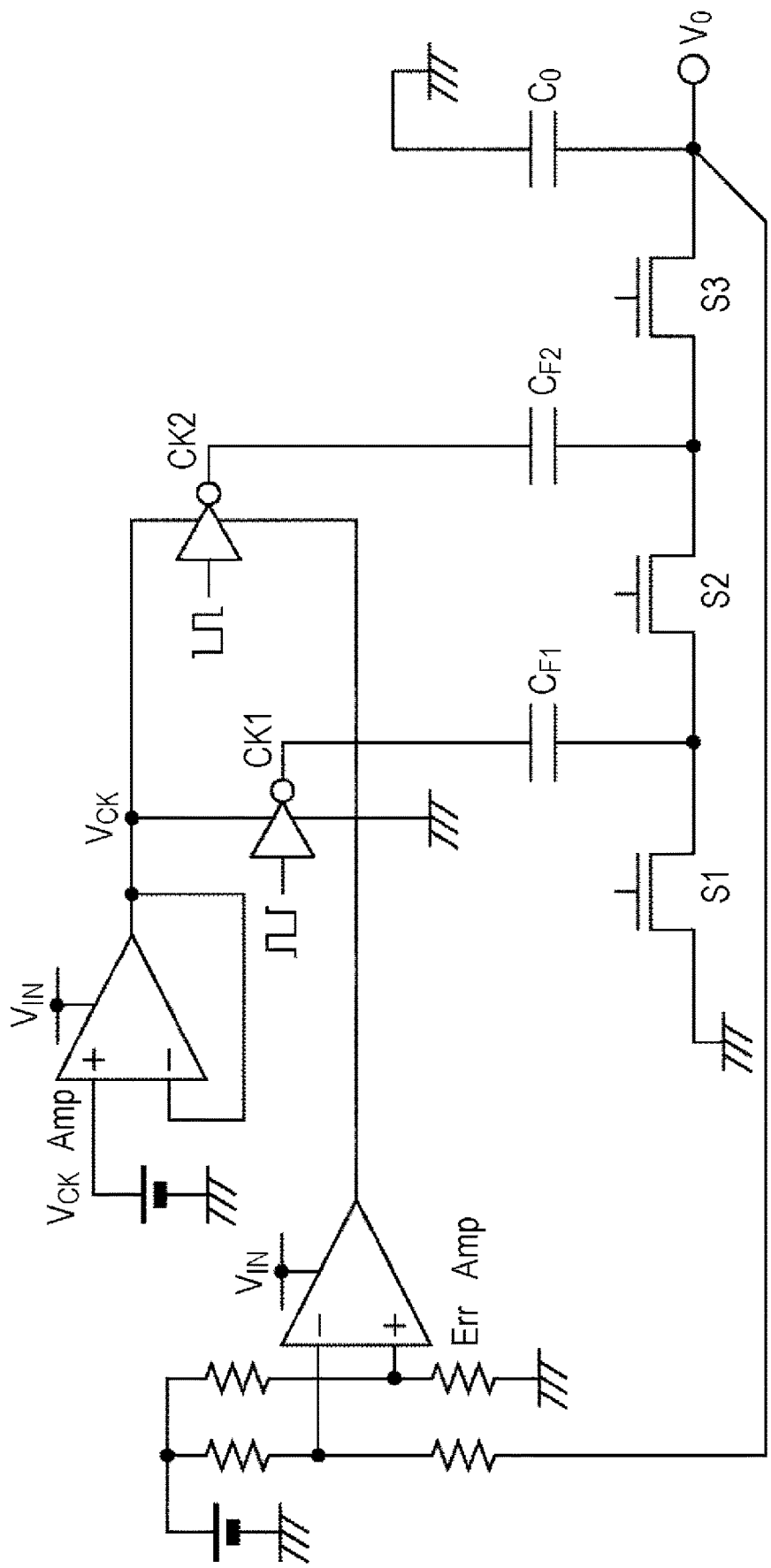
FIG. 10 is a view illustrating a different example of the negative voltage generation unit.

In accordance with embodiments of the present disclosure, the pixel unit 101 includes a circuit having a photodiode, a transistor, and the like, and is formed as a unit pixel in the pixel region. The amplifier unit 102 may include a circuit having a transistor, a current source, and the like and may be formed in the pixel region and/or in an area that is outside of the pixel region (peripheral pixel region). The readout unit 103 generally includes a circuit having an A/D conversion unit or the like and may be formed as a peripheral circuit of the pixel region in an area outside of the pixel region (peripheral circuit region). The negative voltage generation unit 104 may be formed as a peripheral circuit of the pixel region in an area outside of the pixel region (peripheral circuit region). The negative voltage generation unit 104 may include, for example, a charge pump circuit as illustrated in FIG. 9 and/or FIG. 10 which will be described later; a negative potential may be generated by such a charge pump circuit.

As illustrated in FIG. 7, the pixel unit 101, the amplifier unit 102, the readout unit 103, and the negative voltage generation unit 104 may include a common power supply potential also known as a common power supply voltage. In addition, the pixel unit 101 may be connected to pixel ground which is a ground of the pixel region. The amplifier unit 102, the readout unit (A/D conversion unit) 103, and the negative voltage generation unit 104 may be connected to the circuit ground which is a ground located in the area outside of the pixel region (peripheral circuit region).

The pixel unit 101 photoelectrically converts incident light from an object and acquires a charge. The pixel unit 101 reads the charge and provides the read charge to the amplifier unit 102. The amplifier unit 102 amplifies an electric signal provided by the pixel unit 101 and provides the amplified electric signal to the readout unit 13. The readout unit 103 performs A/D conversion of the electric signal amplified in the amplifier unit 102 and reads the converted electric signal as image data.

The negative voltage generation unit 104 generates a negative potential and provides the generated negative potential to the pixel ground. That is, the negative voltage generation unit 104 generates a negative potential as the potential of the pixel ground. The negative voltage generation unit 104 sets the potential of a well (well potential), of each of the pixel ground and the pixel region, as a negative potential that is lower than the well potential of the circuit ground and the peripheral circuit region.

By forming such a configuration, in the imaging element 100, when the power supply potential is reduced or otherwise lowered, the potential of the pixel ground may also be reduced or otherwise lowered in a similar manner and independently from the circuit ground. Thus, it is possible to provide an adequate potential difference (such as a potential difference similar to that in FIG. 1 where the power supply potential is not lowered) as a potential difference between the power supply potential and the pixel ground in the pixel unit 101. Accordingly, it is also possible to control the deterioration of a characteristic of a pixel, such as the number of saturation electrons Qs and/or the completeness of the charge transfer. That is, the imaging element 100 may reduce power consumption while controlling the deterioration of image quality.

In addition, the well potential of the pixel region may also be reduced or otherwise lowered similar to that of the pixel ground. Thus, a potential difference between the power supply potential and the ground potential or the well potential may be similar to the case where the power supply potential is not lowered. That is, the operating potential of each element may be shifted such that it includes the reduced potential. Thus, an operating characteristic of each element, such as a transistor or a photodiode formed in the pixel unit 101, may be similar to that of the imaging element 10 in FIG. 1 where the power supply potential is not reduced or otherwise lowered. That is, by using a design value of the pixel unit 11 of the imaging element 10 in FIG. 1 for the pixel unit 101 of the imaging element 100, the pixel characteristic of the pixel unit 101 may be similar to the pixel characteristic of the pixel unit 11. Thus, in utilizing the imaging element 100, the cost of development, the development time, and the like may be reduced. In addition, the imaging element 100 may reduce power consumption while controlling the deterioration of image quality.

<3. Second Embodiment>
<Imaging Element>

In the imaging element, the photoelectric conversion unit may include a photodiode connected to the well potential of the pixel region, and the transistor may include a readout transistor that controls a readout from the photodiode, a reset transistor that resets a floating diffusion region to which a charge is read from the photodiode, an amplifier transistor that amplifies a potential of the floating diffusion region, and a selection transistor that controls a transfer of a signal output from the amplifier transistor.

As illustrated in the example in FIG. 2, when the readout transistor is off, the gate potential may be set to a potential that is lower than the well potential of the pixel region. Accordingly, when the power supply potential is reduced or otherwise lowered, a gate potential difference between when the readout transistor is on and when the readout transistor is off may be large. That is, the difference between the potential of the gate of the readout transistor when the readout transistor is off and the potential of the gate of the readout transistor when the readout transistor is on may be large. Thus, it is possible to control the generation of noise and the deterioration of image quality.

Figure 8:
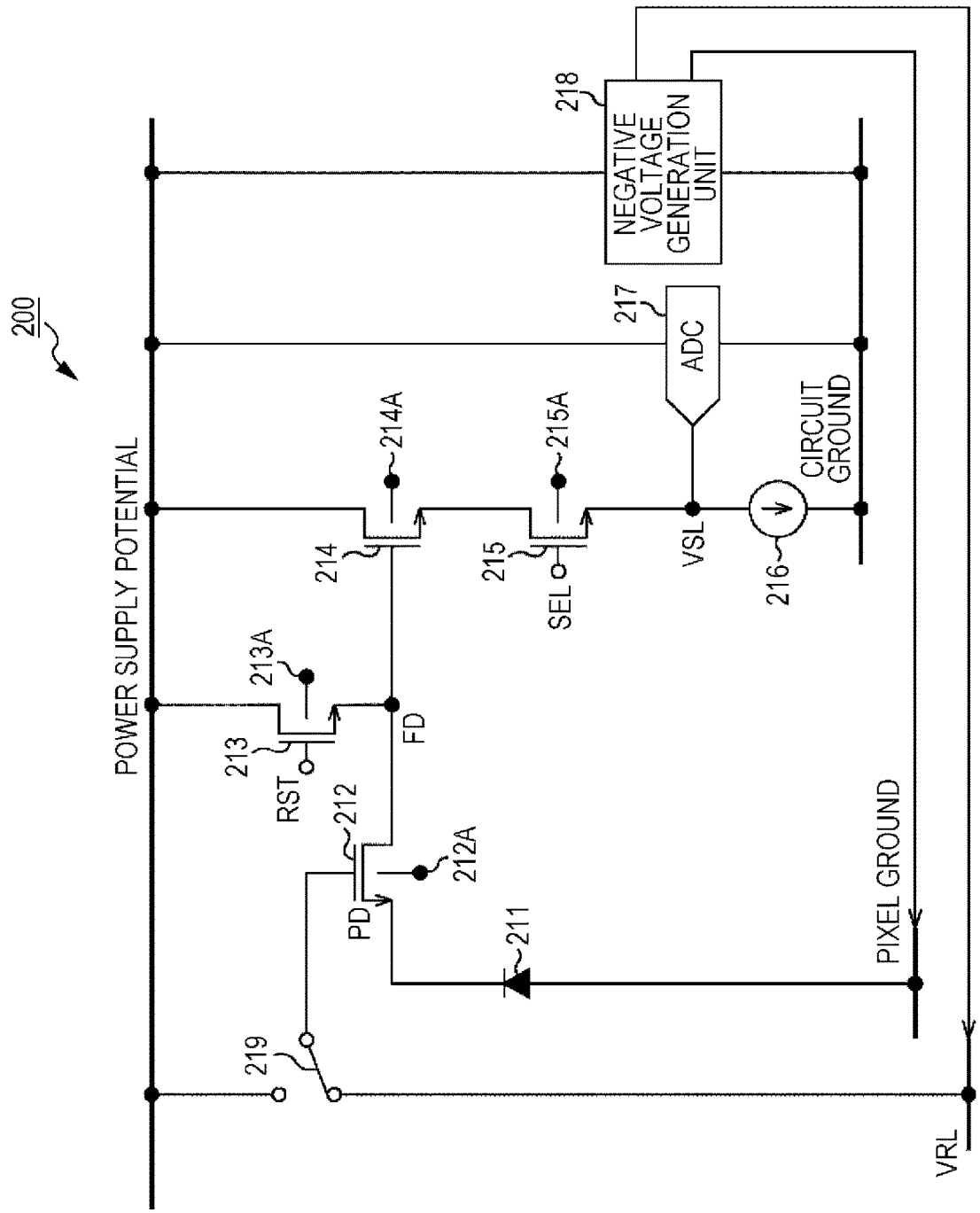
FIG. 8 is a view illustrating a different configuration example of the imaging element.

FIG. 8 illustrates a configuration example of a portion of an imaging element. Similar to the imaging element 100, an imaging element 200, as illustrated in FIG. 8, is a device that photoelectrically converts light from an object and outputs the converted light as image data. As illustrated in FIG. 8, the imaging element 200 includes, as a unit pixel, a photodiode 211, a readout transistor 212, a reset transistor 213, an amplifier transistor 214, and a selection transistor 215 in a pixel region. In addition, the imaging element 200 includes, as a peripheral circuit in an area outside of the pixel region (peripheral circuit region), a current source 216, an ADC 217, a negative voltage generation unit 218, and a switch 219.

The photodiode (PD) 211 photoelectrically converts the received light into a photoelectric charge (for example, a photoelectron), a quantity of which corresponds to a quantity of the received light, and accumulates the photoelectric charge. An anode electrode of the photodiode 211 is connected to the ground (pixel ground) of the pixel region and a cathode electrode thereof is connected to a floating diffusion region (FD) through the readout transistor 212.

The readout transistor 212 controls the readout of a photoelectric charge from the photodiode 211. A drain electrode of the readout transistor 212 is connected to the floating diffusion region and a source electrode thereof is connected to a cathode electrode of the photodiode 211. Also, a gate electrode of the readout transistor 212 is connected to the switch 219 and gate potential is controlled by the switch 219. When the gate potential of the readout transistor 212 is such that the readout transistor 212 is off, the readout of the photoelectric charge from the photodiode 211 is not performed; that is, the photoelectric charge is accumulated in photodiode 211. When the gate potential of the readout transistor 212 is such that the readout transistor 212 is on, the photoelectric charge accumulated in the photodiode 211 is read and provided to the floating diffusion region.

The reset transistor 213 resets the potential of the floating diffusion region. A drain electrode of the reset transistor 213 is connected to the power supply potential and a source electrode thereof is connected to the floating diffusion region. Also, a reset pulse (RST) is provided through a reset line (not illustrated) to the gate electrode of the reset transistor 213. When the reset transistor 213 is off, the floating diffusion region is separated from the power supply potential. When the reset pulse (RST) is provided to the gate electrode of the reset transistor 213, the reset transistor 213 is turned on. By discharging a charge in the floating diffusion region to the power supply potential, the floating diffusion region is reset.

The amplifier transistor 214 amplifies a potential charge in the floating diffusion region (FD) and outputs the amplified charge as an electric signal (analog signal). A gate electrode of the amplifier transistor 214 is connected to the floating diffusion region (FD), a drain electrode of the amplifier transistor 214 is connected to the power supply potential, and a source electrode of the amplifier transistor is connected to a drain electrode of the selection transistor 215. For instance, the amplifier transistor 214 outputs, as a reset signal (reset level), a potential of the floating diffusion region (FD), reset by the reset transistor 213, to the selection transistor 215. The amplifier transistor 214 outputs, as a light accumulation signal (signal level), the potential of the floating diffusion region (FD) to which a photoelectric charge is transferred from the readout transistor 212 to the selection transistor 215.

The selection transistor 215 controls an output of the electric signal, which is provided by the amplifier transistor 214, to the vertical signal line (VSL). The drain electrode of the selection transistor 215 is connected to the source electrode of the amplifier transistor 214 and a source electrode of the selection transistor 215 is connected to the vertical signal line (VSL). Also, a selection pulse (SEL) is provided through a selection line (not illustrated) to a gate electrode of the selection transistor 215. When the selection transistor 215 is off, the amplifier transistor 214 and the vertical signal line (VSL) are electrically separated from each other. Thus, in this state, a signal is not output from the unit pixel. When the selection pulse (SEL) is provided to the gate electrode, the selection transistor 215 is turned on and the unit pixel is selected. That is, the amplifier transistor 214 and the vertical signal line (VSL) are electrically connected to each other and a signal output from an amplifier transistor 214 is provided as a signal of the unit pixel to the vertical signal line (VSL).

In FIG. 8, a configuration of one unit pixel is illustrated. However, a plurality of unit pixels may be arranged in the pixel region. The plurality of unit pixels may be arranged in an arbitrary manner; more likely however, is that the plurality of unit pixels are arranged in a two-dimensional matrix. The vertical signal line (VSL) is a signal line that transmits, to the ADC 217, a signal output from a unit pixel in an assigned column among the plurality of unit pixels in the pixel region. The vertical signal line VSL is connected to a source electrode of a selection transistor 215, a current source 216, and an ADC 217 in the assigned unit pixel.

The current source 216 indicates a load of a peripheral circuit connected to the vertical signal line (VSL). The current source 216 is connected to the vertical signal line (VSL) and ground (circuit ground) of the peripheral circuit.

The ADC 217 performs A/D conversion of a signal provided by each unit pixel through the vertical signal line (VSL) and outputs digital data to a processing unit (not illustrated) in the following stage or to an outer part of the imaging element 200. The ADC 217 is connected to the vertical signal line (VSL). Also, the ADC 217 is connected to the power supply potential and the circuit ground and may be driven by power acquired therefrom.

Similar to the negative voltage generation unit 104 (FIG. 7), the negative voltage generation unit 218, or negative voltage generator, generates a negative potential for the pixel ground and provides the negative potential as the pixel ground to each unit pixel. The negative potential provided to each of the unit pixels may be considered a first negative potential. In addition, the negative voltage generation unit 218 generates a negative potential for the low voltage reference potential VRL other than that for the pixel ground and provides the negative potential as the low voltage reference potential VRL to a pixel scanning unit (not illustrated) to control an operation of each unit pixel. The negative potential for the low voltage reference potential VRL may be considered a second negative potential. The negative voltage generation unit 218 may be connected to the power supply potential and the circuit ground and may be driven by power acquired therefrom. The power supply potential is greater than the low voltage reference potential VRL, the pixel ground, and the circuit ground.

Similar to the negative voltage generation unit 104, the negative voltage generation unit 218 may include a charge pump circuit and may generate a negative potential with the charge pump circuit. In FIG. 9, an example of the charge pump circuit is illustrated. Note that in an example in FIG. 9, the number of stages of the charge pump circuit is illustrated as one, but the number of stages of the charge pump circuit may be more than one. For example, there may be two stages as illustrated in an example in FIG. 10, or there may be three or more stages. By increasing the number of stages of the charge pump circuit, the negative voltage generation unit 218 can generate a greater negative potential.

The negative voltage generation unit 218 may include a charge pump circuit to generate a negative potential, such as a negative voltage, for the pixel ground and a charge pump circuit to generate a negative potential for the VRL. That is, the charge pump circuit that generates a negative potential for the pixel ground may be different from the charge pump circuit that generates a negative potential for the VRL. Alternatively, or in addition, the charge pump circuit that generates a negative potential for the pixel ground may be the same as the charge pump circuit that generates a negative potential for the VRL; in such an instance, the charge pump may generate a plurality of negative potentials.

The potential of the pixel ground (pixel ground potential) and the potential of a well in the pixel region (well potential) are identical. That is, similar to the pixel ground potential, well potential 212A of the readout transistor 212, well potential 213A of the reset transistor 213, well potential 214A of the amplifier transistor 214, and well potential 215A of the selection transistor 215 are set to the negative potential generated by the negative voltage generation unit 218. In other words, the negative voltage generation unit 218 provides the generated negative potential to the pixel ground potential and to the well potential of the pixel region and further sets such a potential to the negative potential.

The pixel scanning unit is formed in an area that is outside of the pixel region (peripheral circuit region) and controls an operation (such as the readout of charge) of each unit pixel, for example, by providing the reset pulse (RST), the selection pulse (SEL), or the like to each unit pixel. Also, the pixel scanning unit includes the switch 219 and provides, to the gate electrode of the readout transistor 212, a readout pulse that controls an operation of the readout transistor 212 by switching a connection of the switch 219.

The switch 219 is formed as a pixel scanning unit in the area that is outside of the pixel region (peripheral circuit region) and is an element that switches, or selects, a connection destination of the gate electrode of the readout transistor 212. The switch 219 connects the gate electrode of the readout transistor 212 to the power supply potential or to the low voltage reference potential VRL. The VRL is set as the negative potential generated by the negative voltage generation unit 218. When the switch 219 connects the gate electrode of the readout transistor 212 to the power supply potential, the readout transistor 212 is turned on. Also, when the switch 219 connects the gate electrode of the readout transistor 212 to the VRL, the readout transistor 212 is turned off.

Note that similar to the negative voltage generation unit 28 in FIG. 2, the negative voltage generation unit 218 sets the low voltage reference potential VRL, that is the gate potential of the readout transistor when the readout transistor is off, such that the gate potential of the readout transistor is lower than the pixel ground potential (that is, the well potential of pixel region). For example, and similar to the imaging element 20, in the imaging element 200, the pixel ground potential is set such that a gate potential difference between when the readout transistor 212 is on and when the readout transistor 22 is large. Thus, as compared to the imaging element 100, the number of saturation electrons Qs of the photodiode 211 can be adequately large and a complete transfer of a charge can be realized. That is, deterioration of the image quality can be controlled.

Also, similar to the negative voltage generation unit 104 (FIG. 7), the negative voltage generation unit 218 sets or makes the pixel ground potential (that is, well potential of pixel region) such that the pixel ground potential is lower than that of the circuit ground potential. Thus, the VRL is set much lower than the pixel ground potential.

Figure 11:
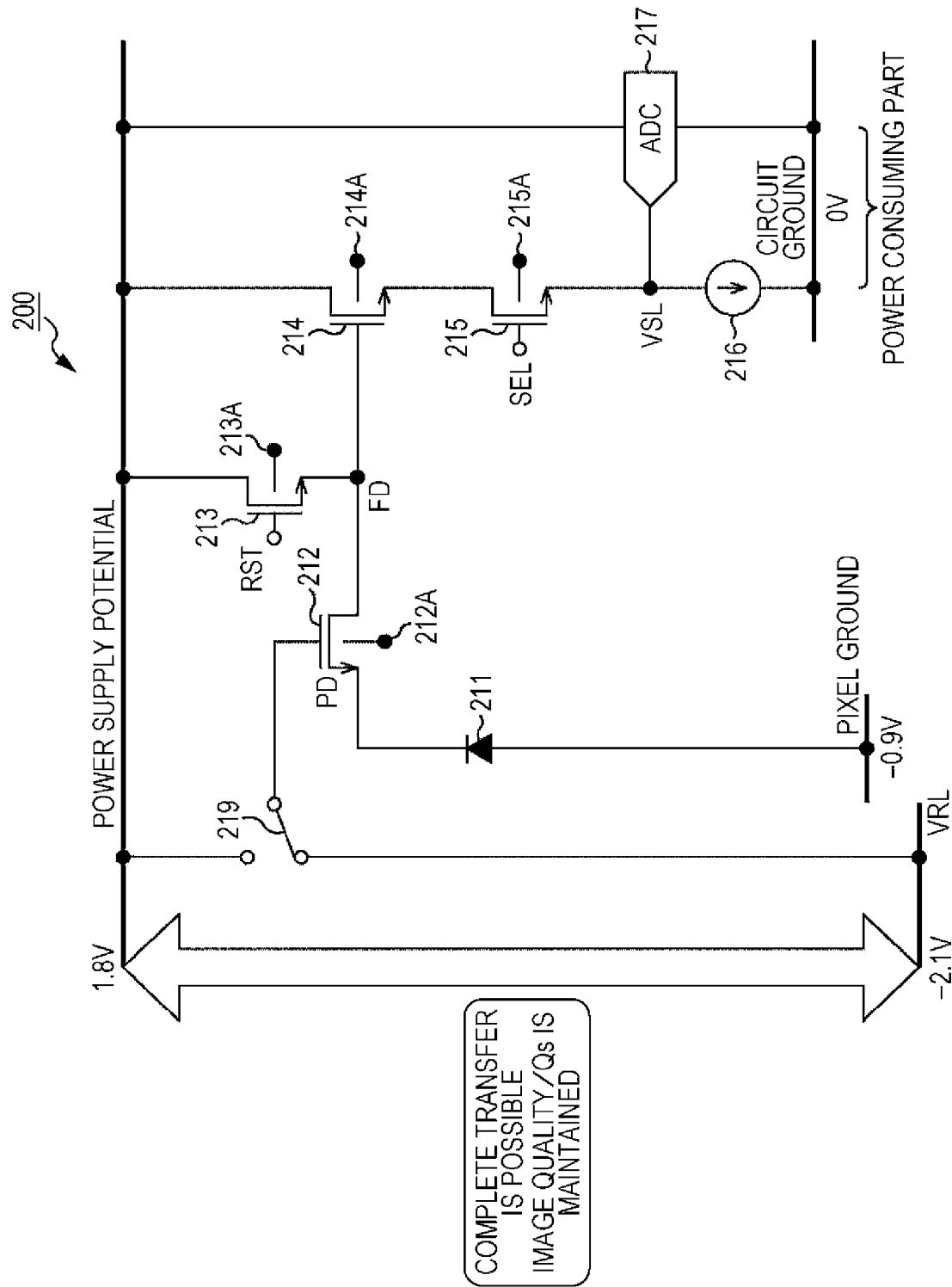
FIG. 11 is a view illustrating a different example of each kind of potential.
Figure 12:
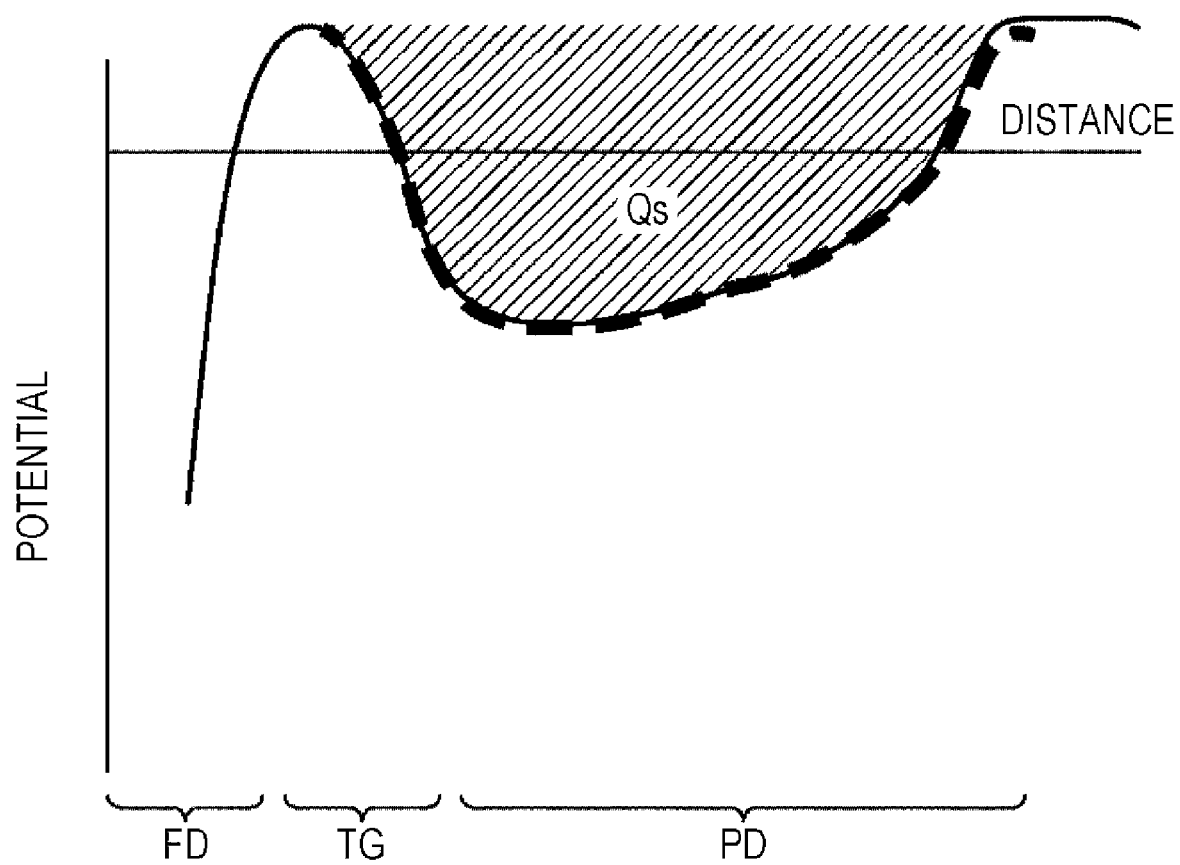
FIG. 12 is a view illustrating an example of the potential in a case of FIG. 11.

Thus, when the power supply potential is reduced or otherwise lowered, in a manner as illustrated in FIG. 11, in order to reduce power consumption in the amplifier transistor 214, the selection transistor 215, the current source 216, the ADC 217, and the like (power consuming part), the negative voltage generation unit 218 sets the pixel ground potential to −0.9 V and sets the VRL to −2.1 V. That is, the pixel ground and VRL are reduced or otherwise lowered similar to power supply potential. Thus, a gate potential difference between when the readout transistor 212 is on and when the readout transistor 212 is off can be maintained at 3.9 V similar to the case of FIG. 3, and thus an adequately large potential difference can be maintained. That is, as illustrated in FIG. 12, the imaging element 200 is configured such that the number of saturation electrons Qs of the photodiode 211 are sufficiently large similar to the case of FIG. 4, and thus a complete transfer of a charge may be realized. Thus, the imaging element 200 may reduce power consumption while controlling deterioration of the image quality.

Note, that in such a case and similar to the imaging element 100, the well potential of the pixel region may also be reduced or otherwise lowered similar to the pixel ground. Thus, the potential difference between the power supply potential and the ground potential or the well potential may be similar to the case where the power supply potential is not reduced or otherwise lowered. That is, the operating potential of each element may be shifted such that it includes the lower potential or lower voltage. Thus, an operating characteristic of each element, such as a photodiode 211, readout transistor 212, reset transistor 213, and the selection transistor 215 in the pixel region may be similar to that of the case of the imaging element 20 in FIG. 2, in which the power supply potential is not reduced or otherwise lowered. That is, by using a design value of each element of the imaging element 20 in FIG. 2 for each element of the imaging element 200, a pixel characteristic of the imaging element 200 may be similar to the pixel characteristic of the imaging element 20. Thus, in utilizing the imaging element 200, the cost of development, the development time, and the like may be reduced. In addition, the imaging element 200 may reduce power consumption while controlling the deterioration of image quality.

<4. Third Embodiment>
<Imaging Element>

The imaging element to which the present technique is applied may include a plurality of semiconductor substrates which are superimposed, or stacked, on each other. In addition, a pixel region and a peripheral circuit region may be respectively formed on the semiconductor substrates.

Figure 13:
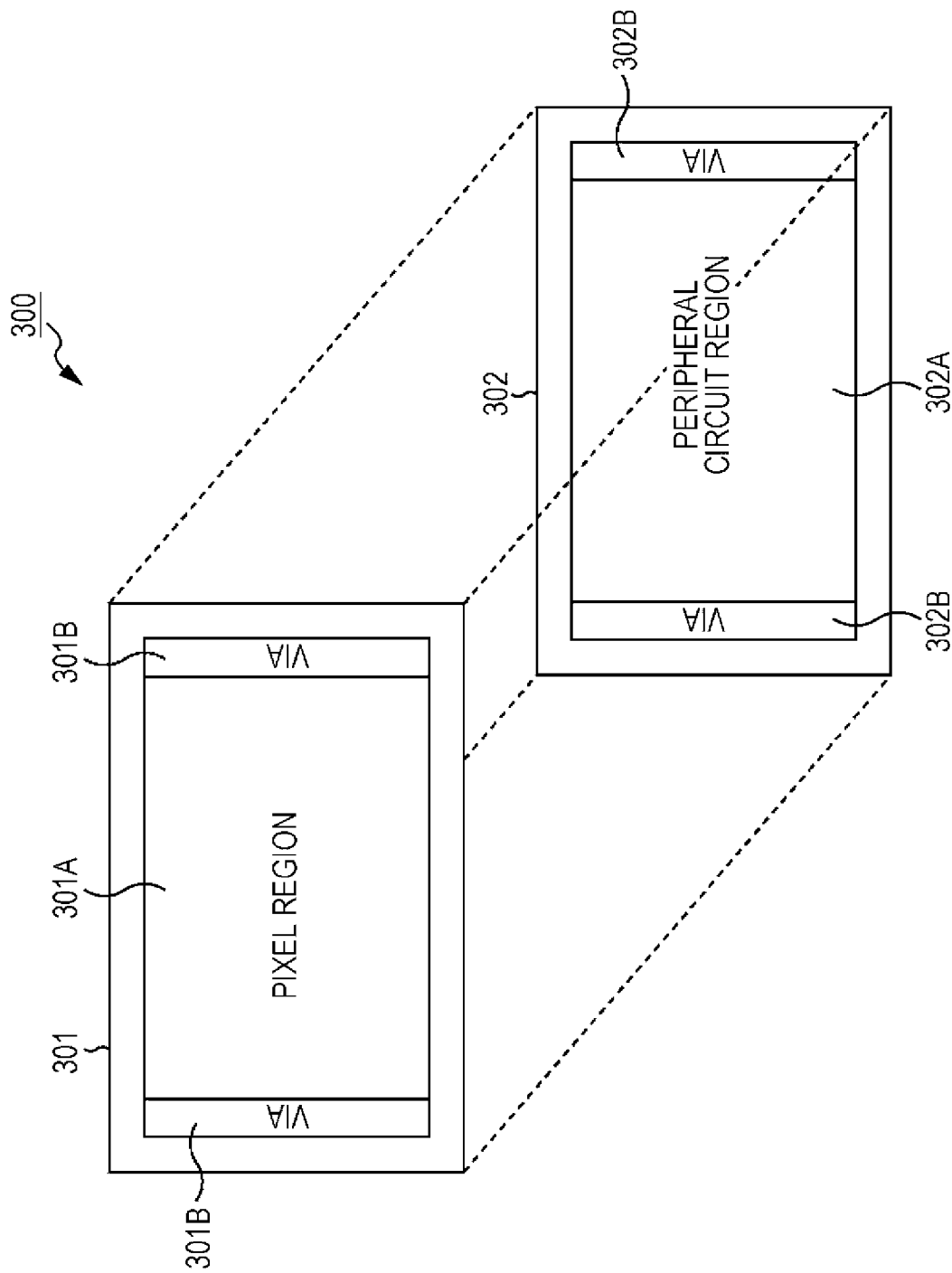
FIG. 13 is a view illustrating a different configuration example of the imaging element.

FIG. 13 illustrates a configuration of an example of the imaging element to which the present technique is applied. Similar to the imaging element 100 and the imaging element 200, an imaging element 300 illustrated in FIG. 13 images an object and acquires digital data of the corresponding image. As illustrated in FIG. 13, the imaging element 300 includes two semiconductor substrates (laminated chip 301 and laminated chip 302) superimposed on each other. Note that the number of layers of the semiconductor substrates (laminated chip) may be greater than two and may be, for example, three or more.

In the laminated chip 301 (also referred to as pixel chip), a pixel region 301A, in which a plurality of unit pixels each of which includes a photoelectric conversion element to photoelectrically convert incident light, is formed. The plurality of unit pixels may be arranged in an arbitrary manner; more likely however, is that the plurality of unit pixels are arranged in a two-dimensional matrix. Also, in the laminated chip 302, a peripheral circuit region 302A is formed which may include a peripheral circuit that processes a pixel signal that is read from the pixel region 301A.

As described above, the laminated chip 301 and the laminated chip 302 are superimposed on each other and form a multi-layer structure (laminated structure). That is, the laminated chip 301 and the laminated chip 302 may be stacked to form a multi-layer structure. Each pixel in the pixel region 301A, formed in the laminated chip 301, and a circuit in the peripheral circuit region 302A, formed in the laminated chip 302, are electrically connected to each other by a through via (VIA) or the like, which is formed in each of a VIA 301B and a VIA 302B.

Figure 14:
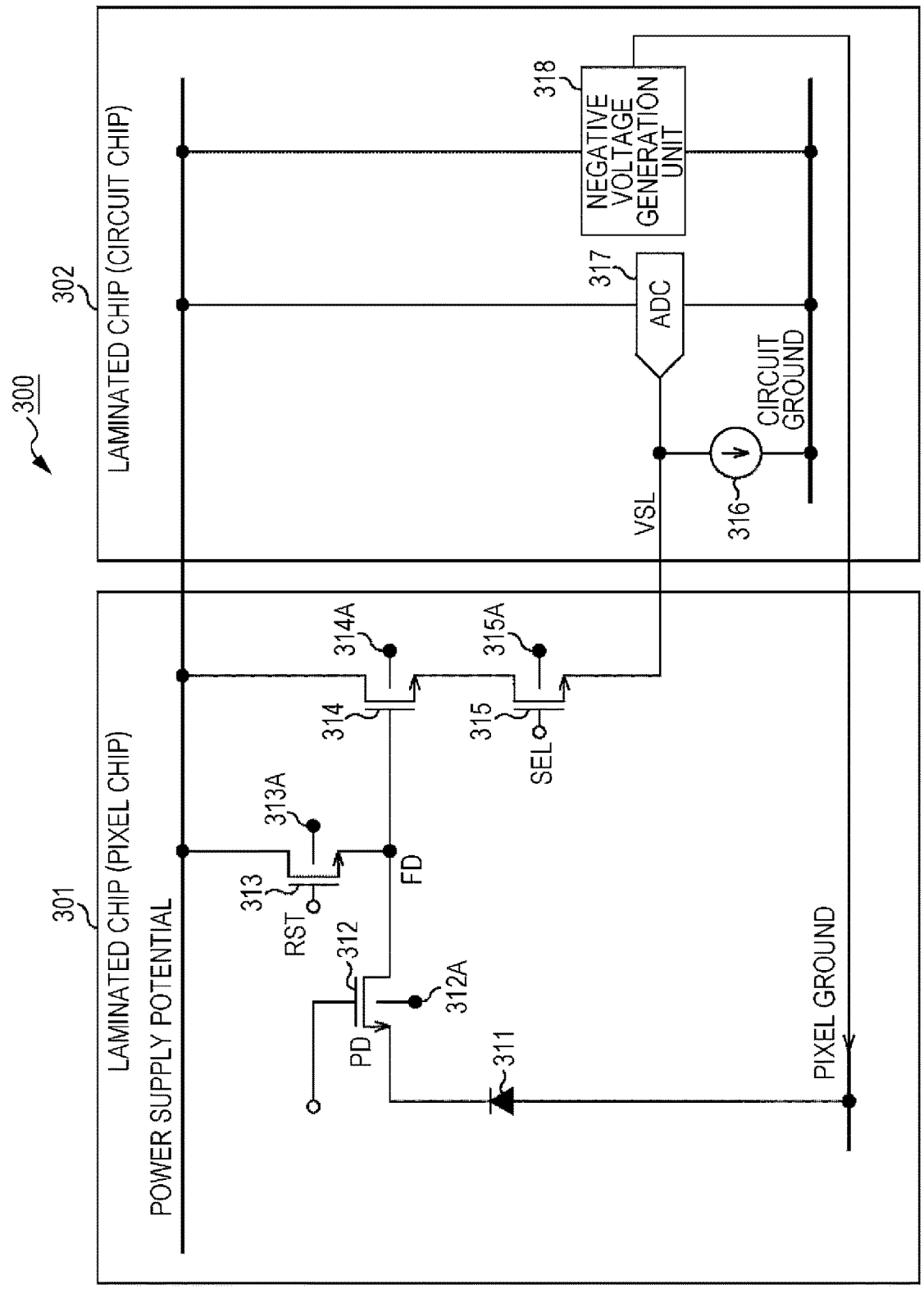
FIG. 14 is a view illustrating a circuit example in a case of FIG. 13.

FIG. 14 illustrates an example of a configuration of a circuit of the imaging element 300. As illustrated in FIG. 14, the imaging element 300 may be configured similar to that of the imaging element 200. In the pixel region 301A of the laminated chip (pixel chip) 301, a photodiode 311 similar to the photodiode 211, a readout transistor 312 similar to the readout transistor 212, a reset transistor 313 similar to the reset transistor 213, an amplifier transistor 314 similar to the amplifier transistor 214, and a selection transistor 315 similar to the selection transistor 215 are formed as a unit pixel. In FIG. 14, a configuration of one unit pixel is illustrated. However, a plurality of unit pixels may be arranged in a predetermined arrangement in the pixel region 301A. For example, the plurality of unit pixels may be arranged in a two-dimensional matrix.

Also, in the peripheral circuit region 302A of the laminated chip (circuit chip) 302, a current source 316 similar to the current source 216, an ADC 317 similar to the ADC 217, and a negative voltage generation unit 318 similar to the negative voltage generation unit 218 are formed. The negative voltage generator, such as a negative voltage generation unit 318, generates a negative potential and provides the negative potential, as pixel ground or well potential, to the pixel region 301A in the laminated chip 301.

Accordingly, the imaging element 300, the pixel region 301A (unit pixel), and the peripheral circuit region 302A (peripheral circuit) are formed respectively on the laminated chips. Thus, by setting the well potential of each laminated chip independently, a configuration of the above-described imaging element 100 or imaging element 200 may be realized.

For example, in one semiconductor substrate, a pixel region and an area outside of the pixel region (such as peripheral circuit region) are formed and a well potential is different in such regions as described above. For example, the pixel ground potential and circuit ground potential are different from each other. Accordingly, it may be necessary to form, in a semiconductor substrate, a plurality of regions having different well potentials; thus, designing and producing such a semiconductor substrate may be difficult.

On the other hand, and as illustrated by the imaging element 300, by respectively forming a pixel region and an area outside of the pixel region (such as peripheral circuit region) on laminated chips, one well potential in each of the laminated chips may be configured such that the well potential is common in the pixel region and the area outside of the pixel region (such as peripheral circuit region). Thus, the design and production of such a configuration may be easier.

Note, that in the example of FIG. 14, the negative voltage generation unit 318 may also set the VRL in a manner that is similar to how VRL is set for the imaging element 200. In such a case, the switch 219 (pixel scanning unit) may be formed in the laminated chip 302, in the laminated chip 301, or in a different laminated chip.

<5. Fourth Embodiment>
<Imaging Apparatus>

Figure 15:
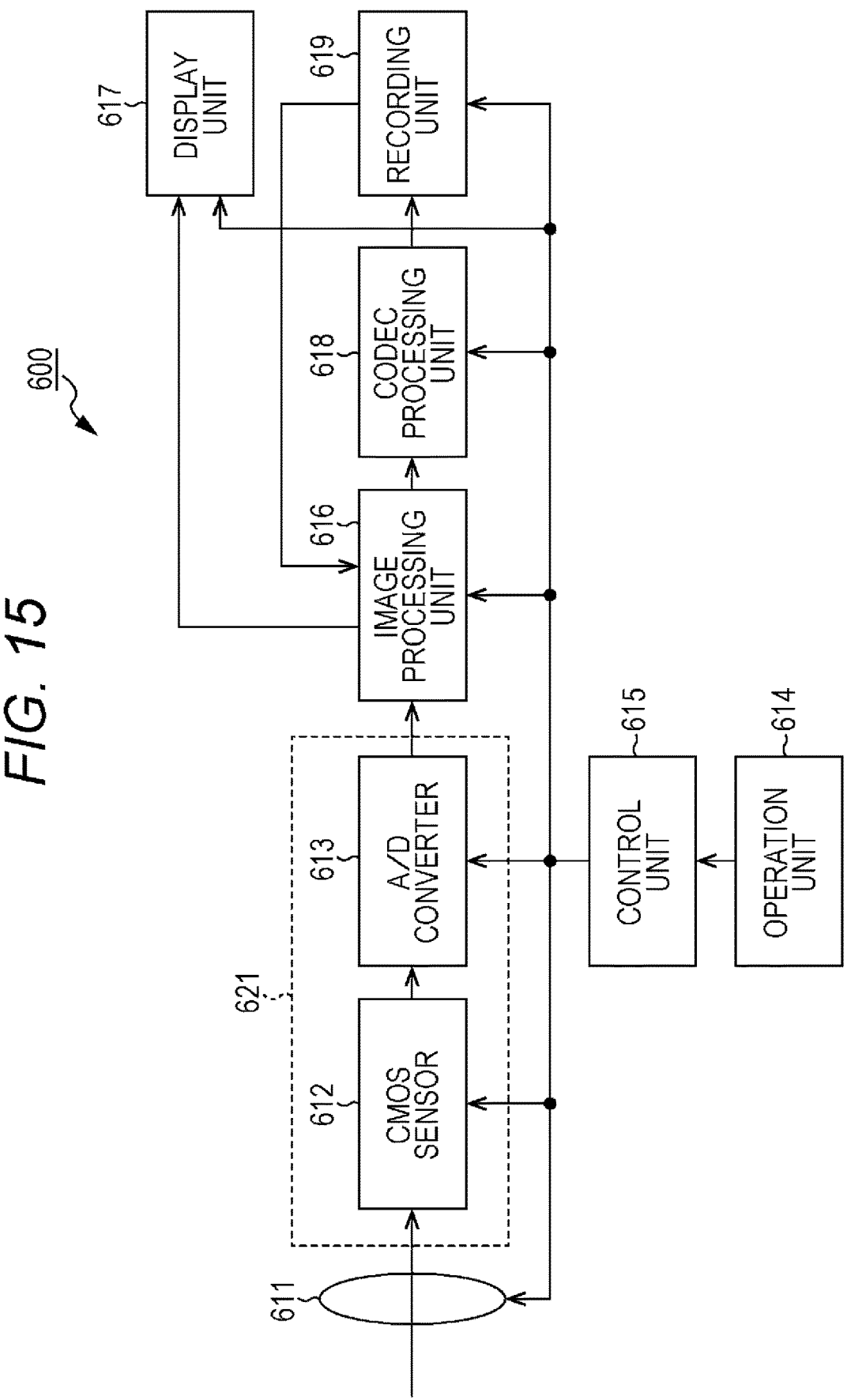
FIG. 15 is a view illustrating a main configuration example of an imaging apparatus.

The application of the present technique is not limited to an imaging element. For example, the present technique may be applied to an apparatus and/or electronic device, such as an imaging apparatus, which includes an imaging element. FIG. 15 is a block diagram illustrating a configuration of an imaging apparatus that is an example of an electronic device to which the present technique is applied. An imaging apparatus 600 illustrated in FIG. 15 may be an apparatus that images an object and outputs an image of the object as an electric signal.

As illustrated in FIG. 15, the imaging apparatus 600 may include but is not limited to an optical unit 611, a CMOS sensor 612, an A/D converter 613, an operation unit 614, a control unit 615, an image processing unit 616, a display unit 617, a codec processing unit 618, and a recording unit 619.

The optical unit 611 includes a lens to adjust a focal point of the object and to collect light from a focused position, a diaphragm to adjust exposure, a shutter to control a timing associated with the image, and the like. The optical unit 611 transmits the light (incident light) from the object and provides the light to the CMOS sensor 612.

The CMOS sensor 612 photoelectrically converts the incident light and provides a signal (pixel signal) of each pixel to the A/D converter 613.

The A/D converter 613 converts the pixel signal, which may be provided by the CMOS sensor 612 at a predetermined timing, into digital data (image data) and serially provides the digital data to the image processing unit 616 at a predetermined timing.

The CMOS sensor 612 and the A/D converter 613 may be integrated or otherwise formed as a single module such as an imaging element 621 (imaging unit). Alternatively, or in addition, the CMOS sensor 612 and the A/D converter 613 may be formed as separate modules.

The operation unit 614 includes, for example, a jog dial (TM), a key, a button, and/or a touch panel. The operation unit 614 receives an operation input performed by a user and provides a signal corresponding to the operation input to the control unit 615.

Based on the signal corresponding to the operation input, which is input by the user with the operation unit 614, the control unit 615 controls the driving of the optical unit 611, the CMOS sensor 612, the A/D converter 613, the image processing unit 616, the display unit 617, the codec processing unit 618, and the recording unit 619 and causes each unit to perform processing related to imaging.

The image processing unit 616 performs image processing of the image data acquired by imaging. Specifically, the image processing unit 616 performs, on the image data provided by the A/D converter 613 (imaging element 621), various kinds of image processing functions, such as color mixture correction, black level correction, white balance adjustment, demosaic processing, matrix processing, gamma correction, or YC conversion. The image processing unit 616 provides image data, on which image processing is performed, to a display unit 817 and the codec processing unit 618.

The display unit 617 is configured, for example, as a liquid crystal display and displays an image of the object based on the image data provided by the image processing unit 616.

The codec processing unit 618 performs coding processing of a predetermined method on the image data provided by the image processing unit 616 and provides the acquired coded data to the recording unit 619.

The recording unit 619 records the coded data from the codec processing unit 618. The coded data recorded in the recording unit 619 is read and decoded by the image processing unit 616 when necessary. The image data acquired by the decoding processing is provided to the display unit 817 and a corresponding image is displayed.

As the imaging element 621, including the CMOS sensor 612 and the A/D converter 613 of the imaging apparatus 600 described above, the above-described present technique may be applied. That is, the imaging element of the above-described embodiment may be used. Accordingly, the imaging element 621 may reduce power consumption while controlling deterioration of the image quality. Thus, by imaging an object, the imaging apparatus 600 may acquire an image of high image quality while controlling an increase in power consumption.

Note that a configuration of the imaging apparatus to which the present technique is applied is not limited to the above-described configuration and may be a different configuration. For example, the imaging apparatus may not only be a digital still camera or a video camera but may also be an information processing apparatus, which includes an imaging function, such as a mobile phone, a smartphone, a tablet device, and/or a personal computer. Also, the imaging apparatus may be a camera module used by being coupled (or embedded as built-in device) to a different information processing apparatus.

Also, a configuration described as one apparatus (or processing unit) in the above description may be divided and may be configured as a plurality of apparatuses (or processing units). Alternatively, a configuration described as a plurality of apparatuses (or processing units) in the above may be integrated and configured as one apparatus (or processing unit). Also, a configuration other than what has been described above may be added to a configuration of each apparatus (or each processing unit). Moreover, a part of a configuration of a certain apparatus (or processing unit) may be included in a configuration of a different apparatus, or different processing unit, as long as a configuration or an operation of a system as a whole is substantially the same.

In the above description, a preferred embodiment of the present disclosure has been described in detail with reference to the attached drawings. However, the technical scope of the present disclosure is not limited to the above example. While these embodiments have been described in conjunction with a number of embodiments, it is evident that many alternatives, modifications, and variations would be or are apparent to those of ordinary skill in the applicable arts. Accordingly, it is intended to embrace all such alternatives, modifications, equivalents, and variations that are within the sprit and scope of the present disclosure including the claims.

Note that the present technique may include the following configuration.

(1) An imaging element comprising:
a photoelectric conversion unit formed in a pixel region and configured to convert light into electrical charge; and
a transistor formed in the pixel region and configured to transfer electric charge from the photoelectric conversion unit, wherein the photoelectric conversion unit is connected to a well of the pixel region having a negative potential.

(2) The imaging element according to (1) above, further comprising a switch, wherein in a first configuration, the switch connects a gate of the transistor to a power supply potential, and in a second configuration, the switch connects the gate of the transistor to a negative potential other than the negative potential of the pixel region.

(3) The imaging element according to (1) or (2) above, wherein the negative potential of the pixel region is between a negative potential of the gate of the transistor and a potential of the power supply.

(4) The imaging element according to any one of (1) to (3) above, further comprising a negative voltage generator configured to provide the negative potential of the pixel region.

(5) The imaging element according to (4) above, wherein the negative voltage generator is connected to a circuit ground having a potential that is different from the negative potential of the gate of the transistor and the voltage of the power supply.

(6) The imaging element of according to any one of (1) to (5) above, further comprising:
a floating diffusion region configured to generate a voltage according to an amount of electrical charge transferred from the photoelectric conversion unit;
a reset transistor configured to reset the floating diffusion region; and
an amplifier transistor connected to the floating diffusion region and a pixel signal line, wherein the amplifier transistor is configured to amplify a potential of the floating diffusion region.

(7) The imaging element according to (6) above, wherein the well of one or more of the transistor, the reset transistor, and the amplifier transistor are connected to the pixel region having the negative potential.

(8) The imaging element according to any one of (1) to (7) above, wherein the well of the transistor is connected to the pixel region having the negative potential.

(9) The imaging element according to any one of (1) to (8) above, further comprising:
a peripheral circuit region having a well potential that is different from the potential of the well of the pixel region, wherein the peripheral circuit region includes a negative voltage generator that provides the negative potential of the pixel region.

(10) The imaging element according to (9) above, wherein the pixel region is formed in a first semiconductor substrate and the peripheral circuit region is formed in a second semiconductor substrate.

(11) The imaging element according to (10) above, wherein the first semiconductor substrate and the second semiconductor substrate form a multilayer structure.

(12) An electronic apparatus comprising:
an optical unit having one or more lenses;
an analog to digital converter unit; and
an image sensor unit including a plurality of unit pixels formed in a pixel region and arranged in a two-dimensional matrix, wherein each unit pixel of the plurality of unit pixels includes:
a photoelectric conversion unit formed in the pixel region and configured to convert light into electrical charge; and
a transistor formed in the pixel region and configured to transfer electric charge from the photoelectric conversion unit, wherein the photoelectric conversion unit is connected to a well of the pixel region having a negative potential.

(13) The electronic apparatus according to (12) above, further comprising a switch, wherein in a first configuration, the switch connects a gate of the transistor to a power supply potential, and in a second configuration, the switch connects the gate of the transistor to a negative potential other than the negative potential of the pixel region.

(14) The electronic apparatus according to (12) or (13) above, wherein the negative potential of the pixel region is between a negative potential of the gate of the transistor and a potential of the power supply.

(15) The electronic apparatus according to any one of (12) to (14) above, further comprising a negative voltage generator configured to provide the negative potential of the pixel region.

(16) The electronic apparatus according to (15) above, wherein the negative voltage generator is connected to a circuit ground having a potential that is different from the negative potential of the gate of the transistor and the voltage of the power supply.

(17) The electronic apparatus of according to any one of (12) to (16) above, further comprising:
a floating diffusion region configured to generate a voltage according to an amount of electrical charge transferred from the photoelectric conversion unit;
a reset transistor configured to reset the floating diffusion region; and
an amplifier transistor connected to the floating diffusion region and a pixel signal line,
wherein the amplifier transistor is configured to amplify a potential of the floating diffusion region.

(18) The electronic apparatus according to (17) above, wherein the well of one or more of the transistor, the reset transistor, and the amplifier transistor are connected to the pixel region having the negative potential.

(19) The electronic apparatus according to any one of (12) to (18) above, wherein the well of the transistor is connected to the pixel region having the negative potential.

(20) An imaging element comprising:
a photoelectric conversion unit connected to a well of a pixel region having a negative potential and configured to convert light into electrical charge;
a floating diffusion region configured to generate a voltage according to an amount of electrical charge transferred from the photoelectric conversion unit;
a reset transistor configured to initialize an amount of electrical charge accumulated in the floating diffusion region;
a readout transistor configured to transfer electric charge from the photoelectric conversion unit to the floating diffusion region;
a negative voltage generator; and
a switch,
wherein in a first configuration, the switch electrically connects a gate of the readout transistor to a common power supply potential, and in a second configuration, the switch electrically connects the gate of the readout transistor to a negative potential provided by the negative voltage generator, the negative potential being less than the common power supply potential and the negative potential of the pixel region.

REFERENCE SIGNS LIST 100 imaging element
101 pixel unit
102 amplifier unit
103 readout unit
104 negative voltage generation unit
200 imaging element
211 photodiode
212 readout transistor
213 reset transistor
214 amplifier transistor
215 selection transistor
216 current source
217 ADC
218 negative voltage generation unit
219 switch
300 imaging element
301 pixel chip
302 circuit chip
311 photodiode
312 readout transistor
313 reset transistor
314 amplifier transistor
315 selection transistor
316 current source
317 ADC 318 negative voltage generation unit
600 imaging apparatus
612 CMOS sensor
613 A/D converter
621 imaging element

The invention claimed is:

1. An imaging device comprising:
a first substrate including:
a pixel that outputs a pixel signal, the pixel including:
a photoelectric conversion unit coupled to a first well that receives a first potential, wherein the first potential is a negative potential relative to a ground potential; and
a transfer transistor coupled to the photoelectric conversion unit; and
a second substrate including:
a peripheral circuit coupled to the pixel, wherein the peripheral circuit is coupled to a second well that receives a second potential greater than the first potential.

2. The imaging device according to claim 1, wherein the peripheral circuit includes an analog to digital converter coupled to the pixel through a signal line.

3. The imaging device according to claim 1, wherein the peripheral circuit includes a current source circuit.

4. The imaging device according to claim 1, wherein the second potential is zero or negative.

5. The imaging device according to claim 1, wherein the pixel is coupled to a first power supply potential.

6. The imaging device according to claim 5, wherein the peripheral circuit is coupled to a second power supply potential.

7. The imaging device according to claim 6, wherein the first power supply potential is the same as the second power supply potential.

8. The imaging device according to claim 1, wherein the first substrate and the second substrate are stacked.

9. The imaging device according to claim 1, wherein the pixel further comprises a floating diffusion, a reset transistor, an amplifier transistor, and a select transistor.

10. The imaging device according to claim 1, wherein the first substrate includes a switch coupled to a gate of the transfer transistor.

11. The imaging device according to claim 10, wherein the gate of the transfer transistor selectively receives, via the switch, a power supply potential or a third potential lower than the first potential.

12. The imaging device according to claim 1, wherein the second substrate includes a switch coupled to a gate of the transfer transistor.

13. The imaging device according to claim 12, wherein the gate of the transfer transistor selectively receives, via the switch, a power supply potential or a third potential lower than the first potential.

14. An imaging device comprising:
a first substrate including:
a pixel that outputs a pixel signal, the pixel including:
a photoelectric conversion unit coupled to a first well that receives a first potential, wherein the first potential is a negative potential; and
a transfer transistor coupled to the photoelectric conversion unit; and
a second substrate including:
a peripheral circuit coupled to the pixel, wherein the peripheral circuit is coupled to a second well that receives a second potential greater than the first potential, wherein the peripheral circuit includes a negative voltage generator that provides the first potential.

15. An apparatus, comprising:
a converter; and
an imaging device including:
a first substrate including;
a pixel that outputs a pixel signal, the pixel including:
a photoelectric conversion unit coupled to a first well that receives a first potential, wherein the first potential is a negative potential relative to a ground potential; and
a transfer transistor coupled to the photoelectric conversion unit; and
a second substrate including:
a peripheral circuit coupled to the pixel, wherein the peripheral circuit is coupled to a second well that receives a second potential greater than the first potential.

16. The apparatus according to claim 15, wherein the peripheral circuit includes a negative voltage generator that provides the first potential.

17. The apparatus according to claim 15, wherein the peripheral circuit includes an analog to digital converter coupled to the pixel through a signal line.

18. The apparatus according to claim 15, wherein the peripheral circuit includes a current source circuit.

19. The apparatus according to claim 15, wherein the second potential is zero or negative.

20. The apparatus according to claim 15, wherein the pixel is coupled to a first power supply potential.

* * * * *